United States Patent
Kato et al.

(10) Patent No.: US 10,656,521 B2
(45) Date of Patent: May 19, 2020

(54) PHOTOSENSITIVE RESIN COMPOSITION, PHOTOSENSITIVE ELEMENT, CURED PRODUCT, SEMICONDUCTOR DEVICE, METHOD FOR FORMING RESIST PATTERN, AND METHOD FOR PRODUCING CIRCUIT SUBSTRATE

(71) Applicant: HITACHI CHEMICAL COMPANY, LTD., Tokyo (JP)

(72) Inventors: Tetsuya Kato, Tokyo (JP); Kenichi Iwashita, Tokyo (JP); Akihiro Nakamura, Tokyo (JP); Akio Nakano, Tokyo (JP); Hiroshi Ono, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 110 days.

(21) Appl. No.: 15/529,869

(22) PCT Filed: Nov. 25, 2015

(86) PCT No.: PCT/JP2015/083137
§ 371 (c)(1),
(2) Date: May 25, 2017

(87) PCT Pub. No.: WO2016/084868
PCT Pub. Date: Jun. 2, 2016

(65) Prior Publication Data
US 2017/0261852 A1    Sep. 14, 2017

(30) Foreign Application Priority Data

Nov. 26, 2014 (JP) .................... 2014-238957
Mar. 30, 2015 (JP) .................... 2015-068543

(51) Int. Cl.
| | | |
|---|---|---|
| G03F 7/038 | (2006.01) | |
| H05K 1/03 | (2006.01) | |
| G03F 7/004 | (2006.01) | |
| H05K 3/00 | (2006.01) | |
| G03F 7/16 | (2006.01) | |
| G03F 7/20 | (2006.01) | |
| G03F 7/30 | (2006.01) | |
| G03F 7/40 | (2006.01) | |
| H01L 21/027 | (2006.01) | |
| H01L 21/48 | (2006.01) | |
| H01L 23/14 | (2006.01) | |
| H05K 3/10 | (2006.01) | |
| H05K 3/18 | (2006.01) | |
| H05K 3/46 | (2006.01) | |

(Continued)

(52) U.S. Cl.
CPC ............ *G03F 7/038* (2013.01); *G03F 7/0045* (2013.01); *G03F 7/0046* (2013.01); *G03F 7/16* (2013.01); *G03F 7/20* (2013.01); *G03F 7/30* (2013.01); *G03F 7/40* (2013.01); *H01L 21/0274* (2013.01); *H01L 21/486* (2013.01); *H01L 21/4857* (2013.01); *H01L 23/145* (2013.01); *H05K 1/0373* (2013.01); *H05K 3/007* (2013.01); *H05K 3/0023* (2013.01); *H01L 21/2885* (2013.01); *H05K 3/064* (2013.01); *H05K 3/107* (2013.01); *H05K 3/182* (2013.01); *H05K 3/188* (2013.01); *H05K 3/4602* (2013.01)

(58) Field of Classification Search
None
See application file for complete search history.

(56) References Cited

U.S. PATENT DOCUMENTS

| | | |
|---|---|---|
| 7,282,324 B2 | 10/2007 | Weber |
| 7,449,280 B2 | 11/2008 | Johnson |
| 8,455,173 B2 | 6/2013 | Sasaki |

(Continued)

FOREIGN PATENT DOCUMENTS

| | | | | |
|---|---|---|---|---|
| EP | 0407086 A2 | * | 1/1991 | ............ G03F 7/004 |
| EP | 1 117 004 A2 | * | 7/2001 | |

(Continued)

OTHER PUBLICATIONS

English translation of JP JP 2001-053670 A (2011) from machine translation from AIPN Japan Patent Office National Center for Industrial Property Information and Training, generated Apr. 9, 2018, 29 pages.*

(Continued)

*Primary Examiner* — Cynthia Hamilton
(74) *Attorney, Agent, or Firm* — Fitch, Even, Tabin & Flannery, LLP

(57) ABSTRACT

A photosensitive resin composition comprises: a resin having a phenolic hydroxyl group; a photosensitive acid generator; a compound having at least one selected from the group consisting of an aromatic ring, a heterocycle and an alicycle, and at least one selected from the group consisting of a methylol group and an alkoxyalkyl group; and an aliphatic compound having two or more functional groups, the functional groups being at least one functional group selected from the group consisting of an acryloyloxy group, a methacryloyloxy group, a glycidyloxy group, an oxetanyl alkyl ether group, a vinyl ether group and a hydroxyl group, wherein the photosensitive acid generator is a sulfonium salt containing an anion having at least one skeleton selected from the group consisting of a tetraphenylborate skeleton, an alkylsulfonate skeleton having 1 to 20 carbon atoms, a phenylsulfonate skeleton and a 10-camphorsulfonate skeleton.

20 Claims, 3 Drawing Sheets

(51) Int. Cl.
*H05K 3/06* (2006.01)
*H01L 21/288* (2006.01)

(56) References Cited

U.S. PATENT DOCUMENTS

| | | | |
|---|---|---|---|
| 2005/0223945 A1* | 10/2005 | Baumgart | C08G 18/6254 106/481 |
| 2006/0040206 A1* | 2/2006 | Nakashima | G03F 7/0757 430/270.1 |
| 2006/0199098 A1 | 9/2006 | Arao | |
| 2008/0220371 A1* | 9/2008 | Kodama | C07C 311/48 430/281.1 |
| 2013/0108965 A1* | 5/2013 | Miyake et al. | C08F 12/24 430/286.1 |
| 2016/0246174 A1* | 8/2016 | Iwashita | G03F 7/027 |
| 2017/0329220 A1* | 11/2017 | Kato | G03F 7/038 |

FOREIGN PATENT DOCUMENTS

| | | |
|---|---|---|
| JP | H6-059444 A | 3/1994 |
| JP | H9-087366 A | 3/1997 |
| JP | H11-310626 A | 11/1999 |
| JP | 2000-344812 A | 12/2000 |
| JP | 2001-217543 A | 8/2001 |
| JP | 2001-337452 A | 12/2001 |
| JP | 2003-215802 A | 7/2003 |
| JP | 2006-243157 A | 9/2006 |
| JP | 2009-049364 A | 3/2009 |
| JP | 2009-244779 A | 10/2009 |
| JP | 2009-251392 A | 10/2009 |
| JP | 2010-210851 A | 9/2010 |
| JP | 2011-029494 A | 2/2011 |
| JP | 2011-053670 A | 3/2011 |
| JP | 2011-082472 A | 4/2011 |
| JP | 2011-201803 A | 10/2011 |
| JP | 2011-215597 A | 10/2011 |
| JP | 2012-163769 A | 8/2012 |
| JP | 2012-227557 A | 11/2012 |
| JP | 2015-132677 A | 7/2015 |
| JP | 2016-009120 A | 1/2016 |
| WO | 2008/010521 A1 | 1/2008 |
| WO | WO-2011162303 A1 * | 12/2011 ........... G03F 7/0392 |
| WO | 2013/115262 A1 | 8/2013 |
| WO | 2014/034539 A1 | 3/2014 |
| WO | 2014/103516 A1 | 7/2014 |
| WO | 2015/046522 A1 | 4/2015 |

OTHER PUBLICATIONS

English translation of JP 2011-215597A (2011) from machine translation from AIPN Japan Patent Office National Center for Industrial Property Information and Training, generated Jan. 1, 2019, 16 pages.*
English translation of JP 2009-251392A (2009) from machine translation from AIPN Japan Patent Office National Center for Industrial Property Information and Training, generated Jan. 1, 2019, 104 pages.*
English translation of JP 2009-244779A (2009) from machine translation from AIPN Japan Patent Office National Center for Industrial Property Information and Training, generated Jan. 6, 2019, 85 pages.*
Butterfield et al (eds) "integrated circuit (IC)", A Dictionary of Computer Science (7 ed.) Publisher: Oxford University Press Print Publication Date: 2016 Print ISBN-13: 9780199688975 Published online: 2016 Current Online Version: 2016 eISBN: 9780191768125 , 2 pages. (Year: 2016).*
International Search Report for PCT/JP2015/083137 dated Feb. 16, 2016; English translation submitted herewith (7 pages).
International Search Report for PCT/JP2015/083105 dated Feb. 9, 2016; English translation submitted herewith (9 pages).
International Preliminary Report on Patentability of WO Appln. No. PCT/JP2015/083137 dated Jun. 8, 2017 in English.
International Preliminary Report on Patentability of WO Appln. No. PCT/JP2015/083105 dated Jun. 8, 2017 in English.

* cited by examiner (a)

(b)

(c)

(d)

(e)

(f)

PHOTOSENSITIVE RESIN COMPOSITION, PHOTOSENSITIVE ELEMENT, CURED PRODUCT, SEMICONDUCTOR DEVICE, METHOD FOR FORMING RESIST PATTERN, AND METHOD FOR PRODUCING CIRCUIT SUBSTRATE

TECHNICAL FIELD

This disclosure relates to a photosensitive resin composition, a photosensitive element, a cured product, a semiconductor device, a method for forming a resist pattern, and a method for producing a circuit substrate.

BACKGROUND ART

In order to form fine patterns in producing semiconductor devices such as semiconductor elements or printed-wiring boards on which the semiconductor elements are mounted, for example, a negative type photosensitive resin composition has been used. In this method, a photosensitive layer is formed on a substrate (for example, a chip for semiconductor element, and a baseplate for printed-wiring board) by the application of a photosensitive resin composition and the like, and is irradiated with active rays through a predetermined pattern. Further, an unexposed part is selectively removed by a developer to form a resin pattern on the substrate. The photosensitive resin composition is therefore required to have high sensitivity to active rays and to be excellent in formability of fine patterns (resolution) and the like. Accordingly, a photosensitive resin composition containing a novolac resin soluble in an alkaline aqueous solution, an epoxy resin, a photo-acid generator (photosensitive acid generator) and the like, and a photosensitive resin composition containing an alkali-soluble epoxy compound having a carboxyl group, a photo-cationic polymerization initiator and the like have been proposed (for example, refer to Patent Literatures 1 to 3 below).

Further, a surface protective film and an interlayer insulating film for use in a semiconductor element are required to have insulation reliability such as heat resistance, electrical properties or mechanical properties. Accordingly, a photosensitive resin composition obtained by adding a cross-linkable monomer to the above-mentioned photosensitive resin composition has been proposed (for example, refer to Patent Literature 4 below).

CITATION LIST

Patent Literature

Patent Literature 1: Japanese Unexamined Patent Publication No. H06-059444
Patent Literature 2: Japanese Unexamined Patent Publication No. H09-087366
Patent Literature 3: International Publication No. WO 2008/010521
Patent Literature 4: Japanese Unexamined Patent Publication No. 2003-215802
Patent Literature 5: Japanese Unexamined Patent Publication No. 2009-49364
Patent Literature 6: Japanese Unexamined Patent Publication No. 2011-29494
Patent Literature 7: Japanese Unexamined Patent Publication No. 2011-82472
Patent Literature 8: Japanese Unexamined Patent Publication No. 2012-227557
Patent Literature International Publication No. WO 2014/034539

SUMMARY OF INVENTION

Technical Problem

Along with the narrowing of a pitch between wirings, an improvement in HAST (Highly Accelerated Temperature and Humidity Stress Test) resistance in a cured product is strongly required for the photosensitive resin composition. However, the photosensitive resin compositions described in the above-mentioned Citation List have room for an improvement in HAST resistance. In particular, the importance of insulation reliability between fine wirings increases, which requires resistance in a HAST test having a severer condition with a higher test temperature, such as 130° C. and 85% RH, as compared to a conventional test for applying a voltage at 85° C. and 60% RH or 85° C. and 85% RH.

An object of the present disclosure is to solve the problems associated with the conventional arts as described above and to provide a photosensitive resin composition which can obtain a cured product having excellent HAST resistance. Also, another object of the present disclosure is to provide a photosensitive element, a cured product and a semiconductor device which are obtained by using the photosensitive resin composition. Further, another object of the present disclosure is to provide a method for forming a resist pattern and a method for producing a circuit substrate which use the photosensitive resin composition or the photosensitive element.

Solution to Problem

As a result of extensive studies to solve the above problems, the present inventors have found a photosensitive resin composition having excellent properties.

That is, the present disclosure provides a photosensitive resin composition comprising: a component (A): a resin having a phenolic hydroxyl group; a component (B): a photosensitive acid generator; a component (C): a compound having at least one selected from the group consisting of an aromatic ring, a heterocycle and an alicycle, and at least one selected from the group consisting of a methylol group and an alkoxyalkyl group; and a component (D): an aliphatic compound having two or more functional groups, the functional groups being at least one functional group selected from the group consisting of an acryloyloxy group, a methacryloyloxy group, a glycidyloxy group, an oxetanyl alkyl ether group, a vinyl ether group and a hydroxyl group, wherein the component (B) is a sulfonium salt containing an anion having at least one skeleton selected from the group consisting of a tetraphenylborate skeleton, an alkylsulfonate skeleton having 1 to 20 carbon atoms, a phenylsulfonate skeleton and a 10-camphorsulfonate skeleton.

According to the photosensitive resin composition of the present disclosure, it is possible to obtain a cured product having excellent HAST resistance. Also, according to the photosensitive resin composition of the present disclosure, it is possible to use the cured product obtained by curing the photosensitive resin composition as an insulating film.

The anion of the component (B) is preferably at least one selected from the group consisting of tetrakis(pentafluorophenyl)borate, trifluoromethanesulfonate, nonafluorobutanesulfonate, p-toluenesulfonate and 10-camphorsulfonate.

The content of the component (D) is preferably 1 to 70 parts by mass with respect to 100 parts by mass of the component (A).

The photosensitive resin composition of the present disclosure may further comprise a compound having a Si—O bond.

The present disclosure provides a photosensitive element comprising: a support; and a photosensitive layer provided on the support, wherein the photosensitive layer comprises the above-mentioned photosensitive resin composition.

The present disclosure provides a cured product of the above-mentioned photosensitive resin composition.

The present disclosure provides a semiconductor device comprising the above-mentioned cured product of the photosensitive resin composition.

The present disclosure provides a method for forming a resist pattern, comprising: a step of forming a photosensitive layer comprising the above-mentioned photosensitive resin composition on a substrate; an exposing step of exposing the photosensitive layer in order to form a predetermined pattern; a developing step of developing the photosensitive layer after the exposing step to obtain a resin pattern; and a heat-treating step of heat-treating the resin pattern.

The present disclosure provides a method for forming a resist pattern, comprising: a step of disposing the photosensitive layer of the above-mentioned photosensitive element on a substrate; an exposing step of exposing the photosensitive layer in order to form a predetermined pattern; a developing step of developing the photosensitive layer after the exposing step to obtain a resin pattern; and a heat-treating step of heat-treating the resin pattern.

The method for forming a resist pattern of the present disclosure may further comprise a step of heat-treating the photosensitive layer (post-exposure heat treatment: hereinafter, this heat treatment is also referred to as "post-exposure baking") between the exposing step and the developing step.

Also, the present disclosure provides a method for producing a circuit substrate, comprising: a conductor layer forming step of subjecting at least a part of an exposed part of the resin pattern after the heat-treating step in the above-mentioned method for forming a resist pattern, and at least a part of an exposed part of the substrate to a plating treatment, to form a conductor layer; and a conductor pattern forming step of removing a part of the conductor layer to forth a conductor pattern, wherein the circuit substrate includes the resin pattern and the conductor pattern.

The conductor layer forming step may include a step of performing electrolytic plating after performing electroless plating, to form the conductor layer, or may include a step of performing electrolytic plating after performing sputtering, to form the conductor layer.

The conductor pattern forming step may include a step of removing a part of the conductor layer by etching, to form the conductor pattern, or may include a step of removing a part of the conductor layer by polishing, to form the conductor pattern.

Advantageous Effects of Invention

The present disclosure can obtain a photosensitive resin composition which can provide a cured product having excellent HAST resistance. Also, the present disclosure can provide a photosensitive element, a cured product and a semiconductor device which are obtained by using the photosensitive resin composition. Further, the present disclosure can provide a method for forming a resist pattern and a method for producing a circuit substrate using the photosensitive resin composition or the photosensitive element.

The present disclosure can provide the application of the photosensitive resin composition or the photosensitive element to the formation of the resist pattern. The present disclosure can provide the application of the photosensitive resin composition or the photosensitive element to the production of the circuit substrate. The present disclosure can provide the application of the photosensitive resin composition or its cured product to the resist pattern. The present disclosure can provide the application of the photosensitive resin composition or its cured product to the circuit substrate. The present disclosure can provide the application of the photosensitive resin composition or its cured product to the surface protective film or the interlayer insulating film of the semiconductor element. The present disclosure can provide the application of the photosensitive resin composition or its cured product to the solder resist or the interlayer insulating film of a wiring board material.

DESCRIPTION OF EMBODIMENTS

Figure 1:
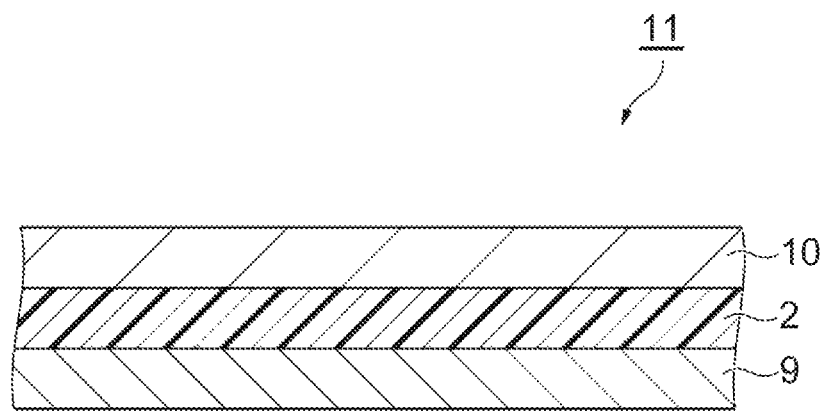
FIG. 1 is a schematic sectional view showing a photosensitive element of the present embodiment.

Hereinafter, one embodiment of the present disclosure will be specifically described, but the present disclosure is not limited thereto.

In the present specification, the terms "layer" and "film" include a structure having a shape which is formed on a part, in addition to a structure having a shape which is formed on the whole surface, when the layer and the film have been observed as a plan view. The term "step" encompasses not only an independent step but also a step which cannot be clearly distinguished from other steps, as long as an intended purpose of the step is achieved. The term "EO-modified" means that the compound has a (poly)oxyethylene group, and the term "PO-modified" means that the compound has a (poly)oxypropylene group. Herein, the "(poly)oxyethylene group" means at least one of an oxyethylene group and a polyoxyethylene group in which two or more ethylene groups are linked via an ether bond. The "(poly)oxypropylene group" means at least one of an oxypropylene group and a polyoxypropylene group in which two or more propylene groups are linked via an ether bond. The term "Si—O bond" refers to a bond between a silicon atom and an oxygen atom, and may be a part of a siloxane bond (Si—O—Si bond). The numerical range expressed by using "to" refers to the range including the numeric values before and after "to" as the minimum value and the maximum value, respectively. In the specification, in the numerical ranges described stepwise, the upper or lower limit of the numerical range of a certain stage may be replaced with the upper or lower limit of the numerical range of another stage. In the numerical range described in the specification, the upper or lower limit of the numerical range thereof may be replaced with values described in Examples. "A or B" may contain any one of A and B, and may contain both A and B. The materials which are exemplified below can be used singly, or in mixture of two or more thereof, unless otherwise specifically indicated.

When a plurality of substances corresponding to each of components exists in a composition, the content of each of the components in the composition means the total amount of the plurality of substances which exist in the composition, unless otherwise specifically indicated.

<Photosensitive Resin Composition>

A photosensitive resin composition of the present embodiment comprises: a component (A): a resin having a phenolic hydroxyl group; a component (B): a photosensitive acid generator; a component (C): a compound having at least one selected from the group consisting of an aromatic ring, a heterocycle and an alicycle, and at least one selected from the group consisting of a methylol group and an alkoxyalkyl group; and a component (D): an aliphatic compound having two or more functional groups, the functional groups being at least one functional group selected from the group consisting of an acryloyloxy group, a methacryloyloxy group, a glycidyloxy group, an oxetanyl alkyl ether group, a vinyl ether group and a hydroxyl group, wherein the component (B) is a sulfonium salt containing an anion having at least one skeleton selected from the group consisting of a tetraphenylborate skeleton, an alkylsulfonate skeleton having 1 to 20 carbon atoms, a phenylsulfonate skeleton and a 10-camphorsulfonate skeleton. In the specification, these components may be merely referred to as the component (A), the component (B), the component (C), the component (D) and the like.

The present inventors presume that the reasons why the cured product of the photosensitive resin composition of the present embodiment has excellent HAST resistance are as follows. The corrosion of wiring due to free fluoride in the insulating material is considered to decrease resistance of an insulating material and cause a short circuit in a HAST test. Heretofore, when an insulating material obtained by using a photosensitive resin composition contains a photosensitive acid generator, HAST resistance can be decreased by free fluoride generated from the photosensitive acid generator. On the other hand, it is presumed that the HAST resistance is improved in the present embodiment since a compound hardly generating free fluoride as compared with the conventional one is used as the component (B).

Along with improvement in performance of electronic equipment in recent years, higher integration and higher reliability of semiconductor elements have been achieved year by year. Along with higher integration of semiconductor elements, the formation of finer pattern is required. Therefore, improvement in resolution by the unit of even 1 μm is continuously required for the photosensitive resin composition.

When the interlayer insulating film having an increased thickness is formed, the insulation between wirings in the thickness direction of the layer can be improved to prevent short circuiting of wiring, and therefore the reliability of the insulation between wirings is improved. Further, in a case of mounting a chip, when a semiconductor element has a thick interlayer insulating film, the stress applied to the pad from a solder bump can be relaxed, so that connection failures hardly occur in mounting. Therefore, from the viewpoints of excellent insulation reliability and productivity in mounting a chip, a thick film of photosensitive resin composition with a thickness more than 20 μm is required to be formed.

However, for example, the photosensitive resin compositions described in Patent Literatures 1 and 4 provide resolution with a space width of about 5 μm when a coating film has a thickness of 10 μm or less, but excellent resolution cannot be obtained when a thick film is made therefrom. Also, the photosensitive resin compositions described in Patent Literatures 2 and 3 have room for an improvement in resolution when a thick film is made therefrom. On the other hand, the present embodiment can provide a photosensitive resin composition which can form a resist pattern having excellent resolution and sensitivity on a substrate (for example, a baseplate). The photosensitive resin composition of the present embodiment has excellent resolution and sensitivity even when a coating film having a thickness more than 20 μm is formed.

The present inventors presume that the reasons why the photosensitive resin composition of the present embodiment has excellent resolution are as follows. First, the solubility of the component (A) in a developer is improved with the addition of the components (C) and (D) in an unexposed part. Subsequently, in an exposed part, the catalytic effect of the acid generated from the component (B) allows the methylol groups or the alkoxyalkyl groups in the component (C) to react with each other accompanied with dealcoholization, or allows the methylol group or the alkoxyalkyl group in the component (C) to react with the component (A) accompanied with dealcoholization, so that the solubility of the composition drastically decreases in a developer. Therefore, due to the remarkable difference in solubility in a developer between the unexposed part and the exposed part in development, excellent resolution is obtained.

The photosensitive resin composition of the present embodiment can comprise a component (E): a sensitizer, a component (F): a solvent, a component (G): a compound having a Si—O bond, and the like, if necessary.

(Component (A))

The photosensitive resin composition of the present embodiment comprises a resin having a phenolic hydroxyl group. The resin having a phenolic hydroxyl group is not particularly limited, and preferably a resin soluble in an alkali aqueous solution, and more preferably a novolac resin from the viewpoint of further improving resolution. The novolac resin, for example, is obtained from condensation of phenols and aldehydes under presence of a catalyst.

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol, and β-naphthol. One of the phenols can be used singly, or a mixture of two or more thereof can be used.

Examples of the aldehydes include formaldehyde, paraformaldehyde, acetaldehyde, and benzaldehyde. One of the aldehydes can be used singly, or a mixture of two or more thereof can be used.

As the novolac resin, for example, a cresol novolac resin can be used. Specific examples of the novolac resin include a phenol/formaldehyde condensation novolac resin, a phenol-cresol/formaldehyde condensation novolac resin, a cresol/formaldehyde condensation novolac resin, and a phenol-naphthol/formaldehyde condensation novolac resin.

Examples of the component (A) other than novolac resins include polyhydroxystyrene and a copolymer thereof, a phenol-xylylene glycol condensation resin, a cresol-xylylene glycol condensation resin, and a phenol-dicyclopentadiene condensation resin.

One of the component (A) can be used singly, or a mixture of two or more thereof can be used.

From the viewpoints of the further excellent resolution, developability, thermal shock property, heat resistance and the like, of a resin pattern to be obtained, the weight average molecular weight of the component (A) may be 100000 or less, 1000 to 80000, 2000 to 50000, 2000 to 20000, 3000 to 15000, or 5000 to 15000.

In the present embodiment, the weight average molecular weight of each component can be measured by gel permeation chromatography (GPC) under the following conditions, using a calibration curve of standard polystyrene, for example.

Device: Hitachi Model L-6000 (manufactured by Hitachi, Ltd.)

Column: Gel Pack GL-R420+Gel Pack GL-R430+Gel Pack GL-R440 (total of 3, trade name manufactured by Hitachi Chemical Co., Ltd.)

Column Specification: 10.7 mmφ×300 mm

Eluent: Tetrahydrofuran

Measuring Temperature: 40° C.

Flow rate: 1.75 ml/min

Detector: L-3300R1 (manufactured by Hitachi, Ltd.)

From the viewpoint that the photosensitive layer formed by using the photosensitive resin composition to be obtained tends to have further excellent developability in an alkali aqueous solution, the content of the component (A) may be 10 to 90 mass %, 30 to 90 mass %, 30 to 80 mass %, 40 to 80 mass %, or 40 to 60 mass %, based on the total amount of the photosensitive resin composition (excluding the component (F) when the component (F) is used).

(Component (B))

The photosensitive resin composition of the present embodiment comprises a photosensitive acid generator. The photosensitive acid generator is a compound which generates an acid by the irradiation of active rays and the like. The catalytic effect of the acid generated from the photosensitive acid generator allows the methylol groups or the alkoxyalkyl groups in the component (C) to react with each other accompanied with dealcoholization, or allows the methylol group or the alkoxyalkyl group in the component (C) to react with the component (A) accompanied with dealcoholization, so that the solubility of the composition drastically decreases in a developer, which allows a pattern of negative type to be forming.

The component (B) is not particularly limited as long as being a sulfonium salt containing an anion having at least one skeleton selected from the group consisting of a tetraphenylborate skeleton, an alkylsulfonate skeleton having 1 to 20 carbon atoms, a phenylsulfonate skeleton and a 10-camphorsulfonate skeleton. A hydrogen atom of a phenyl group of the tetraphenylborate skeleton may be substituted with at least one selected from the group consisting of a fluorine atom, a chlorine atom, a bromine atom, an iodine atom, a cyano group, a nitro group, a hydroxyl group, an alkyl group having 1 to 12 carbon atoms, an alkoxy group having 1 to 12 carbon atoms, an alkylcarbonyl group having 2 to 12 carbon atoms and an alkoxycarbonyl group having 2 to 12 carbon atoms, and substituent groups may be the same or different from each other when a plurality of substituent groups exists. A hydrogen atom of the alkylsulfonate skeleton may be substituted with at least one selected from the group consisting of a fluorine atom, a chlorine atom, a bromine atom, an iodine atom, a cyano group, a nitro group, a hydroxyl group, an alkoxy group, an alkylcarbonyl group and an alkoxycarbonyl group, and substituent groups may be the same or different from each other when a plurality of substituent groups exists. A hydrogen atom of a phenyl group of the phenylsulfonate skeleton may be substituted with at least one selected from the group consisting of a fluorine atom, a chlorine atom, a bromine atom, an iodine atom, a cyano group, a nitro group, a hydroxyl group, an alkyl group having 1 to 12 carbon atoms, an alkoxy group having 1 to 12 carbon atoms, an alkylcarbonyl group having 2 to 12 carbon atoms and an alkoxycarbonyl group having 2 to 12 carbon atoms, and substituent groups may be the same or different from each other when a plurality of substituent groups exists.

Examples of the cation of the sulfonium salt used as the component (B) include triarylsulfonium. Examples of triarylsulfonium include at least one selected from the group consisting of a compound represented by the following general formula (b1), a compound represented by the following general formula (b2), a compound represented by the following general formula (b3), and a compound represented by the following general formula (b4).

[Chemical Formula 1]

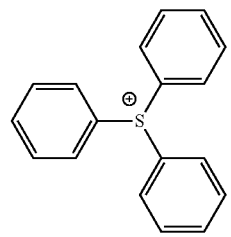

(b1)

[Chemical Formula 2]

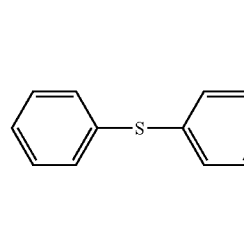

(b2)

[Chemical Formula 3]

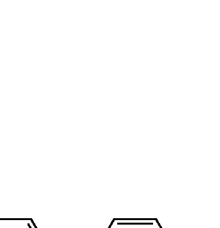

(b3)

[Chemical Formula 4]

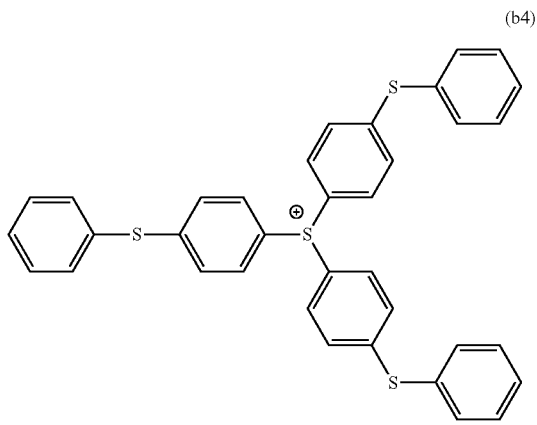

(b4)

A hydrogen atom of a phenyl group of the general formulae (be to (b4) may be substituted with at least one selected from the group consisting of a hydroxyl group, an alkyl group having 1 to 12 carbon atoms, an alkoxy group having 1 to 12 carbon atoms, an alkylcarbonyl group having 2 to 12 carbon atoms and an alkoxycarbonyl group having 2 to 12 carbon atoms, and a plurality of substituent groups may be the same or different from each other when a plurality of substituent groups exists.

The sulfonium salt used as the component (B) is preferably a compound having at least one selected from the group consisting of [4-(4-biphenylylthio)phenyl]-4-biphenylylphenylsulfonium, (2-methyl)phenyl[4-(4-biphenylylthio)phenyl]4-biphenylylsulfonium, [4-(4-biphenylylthio)-3-methylphenyl]4-biphenylylphenylsulfonium, (2-ethoxy)phenyl[4-(4-biphenylylthio)-3-ethoxyphenyl] 4-biphenylylsulfonium and tris[4-(4-acetylphenylsulfanil)phenyl]sulfonium, as a cation, from the viewpoints of further excellent sensitivity and resolution.

Examples of the sulfonium salt used as the component (B) include trifluoromethane sulfonate, nonafluorobutane sulfonate, heptadecafluorooctane sulfonate, tetrakis(pentafluorophenyl)borate, methane sulfonate, butane sulfonate, octane sulfonate, tetraphenylborate, p-toluenesulfonate and 10-camphorsulfonate, as an anion. From the viewpoints of further excellent HAST resistance and sensitivity, the anion of the sulfonium salt is preferably at least one selected from the group consisting of tetrakis(pentafluorophenyl)borate, trifluoromethanesulfonate, nonafluorobutanesulfonate, p-toluenesulfonate and 10-camphorsulfonate.

Specific examples of the sulfonium salt include (2-ethoxy)phenyl[4-(4-biphenylylthio)-3-ethoxyphenyl] 4-biphenylyl sulfonium nonafluorobutanesulfonate, [4-(4-biphenylylthio)phenyl]-4-biphenylylphenylsulfonium tetrakis(pentafluorophenyl)borate, and tris[4-(4-acetylphenylsulfanil)phenyl]sulfonium tetrakis(pentafluorophenyl)borate. One of the sulfonium salt can be used singly, or a mixture of two or more thereof can be used.

One of the component (B) can be used singly, or a mixture of two or more thereof can be used.

The content of the component (B) may be 0.1 to 15 parts by mass, 0.3 to 10 parts by mass, 1 to 10 parts by mass, 3 to 10 parts by mass, 5 to 10 parts by mass, or 6 to 10 parts by mass with respect to 100 parts by mass of the component (A) from the viewpoint of further improving the sensitivity, resolution, pattern shape and the like of the photosensitive resin composition of the present embodiment. In the specification, 100 parts by mass of the component (A) means 100 parts by mass of the solid content of the component (A).

(Component (C))

The photosensitive resin composition of the present embodiment comprises a compound having at least one selected from the group consisting of an aromatic ring, a heterocycle and an alicycle, and at least one selected from the group consisting of a methylol group and an alkoxyalkyl group, as the component (C) (the components (D) and (E) are not contained). Herein, the aromatic ring means a hydrocarbon group (for example, a hydrocarbon group having 6 to 10 carbon atoms) having aromaticity, and examples thereof include a benzene ring and a naphthalene ring. The heterocycle means a cyclic group (for example, a cyclic group having 3 to 10 carbon atoms) having at least one hetero atom such as a nitrogen atom, an oxygen atom and a sulfur atom, and examples thereof include a pyridine ring, an imidazole ring, a pyrrolidinone ring, an oxazolidinone ring, an imidazolidinone ring and a pyrimidinone ring. The alicycle means a cyclic hydrocarbon group (for example, a cyclic hydrocarbon group having 3 to 10 carbon atoms) having no aromaticity, and examples thereof include a cyclopropane ring, a cyclobutane ring, a cyclopentane ring and a cyclohexane ring. The alkoxyalkyl group means an alkyl group bonded to another alkyl group through an oxygen atom. In the alkoxyalkyl group, the two alkyl groups may be the same or different from each other, and examples thereof may include an alkyl group having 1 to 10 carbon atoms.

The photosensitive resin composition comprises the component (C), which allows the methylol groups or the alkoxyalkyl groups in the component (C) to react with each other accompanied with dealcoholization, or allows the methylol group or the alkoxyalkyl group in the component (C) to react with the component (A) accompanied with dealcoholization in exposing (or in exposing and a post-exposure heat treatment for curing), so that the solubility of the composition drastically decreases in a developer, which allows a pattern of negative type to be formed. Also, the formation of a cross-linked structure resulting from the reaction of the component (C) with the component (A) can prevent the resin pattern from being weakened and melted when the photosensitive layer is cured by heating after the formation of the resin pattern. Specifically, the component (C) is preferably at least one selected from the group consisting of a compound having a phenolic hydroxyl group (the component (A) is not contained), a compound having a hydroxymethylamino group, and a compound having an alkoxy methylamino group. The compound having a phenolic hydroxyl group has the methylol group or the alkoxyalkyl group, which can further increase the dissolution rate of an unexposed part in development using an alkaline aqueous solution to further improve the sensitivity of the photosensitive layer. One of the component (C) can be used singly, or a mixture of two or more thereof can be used.

Although a conventionally known compound can be used as the compound having a phenolic hydroxyl group, a compound represented by the following general formula (1) is preferred from the viewpoint of excellent balance between an effect for enhancing the dissolution of an unexposed part and an effect for preventing the melting of a photosensitive resin composition layer in curing.

[Chemical Formula 5]

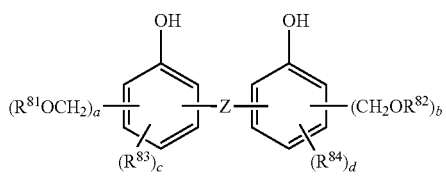

(1)

In the general formula (1), Z represents a single bond or a divalent organic group; $R^{81}$ and $R^{82}$ each independently represent a hydrogen atom or a monovalent organic group; $R^{83}$ and $R^{84}$ each independently represent a monovalent organic group; a and b each independently represent an integer of 1 to 3; and c and d each independently represent an integer of 0 to 3. Herein, examples of the monovalent organic group include an alkyl group having 1 to 10 carbon atoms such as a methyl group, an ethyl group and a propyl group; an alkenyl group having 2 to 10 carbon atoms such as a vinyl group; an aryl group having 6 to 30 carbon atoms such as a phenyl group; and a group obtained by substituting a part or all of hydrogen atom of these hydrocarbon groups with a halogen atom such as fluorine atom. $R^{81}$ to $R^{84}$ each may be the same or different from each other when a plurality of $R^{81}$ to $R^{84}$ each exists.

The compound represented by the general formula (1) is preferably a compound represented by the following general formula (2).

[Chemical Formula 6]

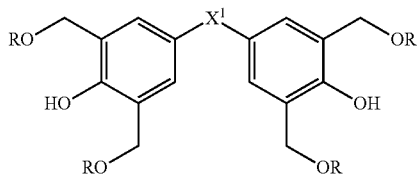

(2)

In the general formula (2), $X^1$ represents a single bond or a divalent organic group, and a plurality of R each independently represents an alkyl group (for example, an alkyl group having 1 to 10 carbon atoms). A plurality of R may be the same or different from each other.

As the compound having a phenolic hydroxyl group, a compound represented by the following general formula (3) may be used.

[Chemical Formula 7]

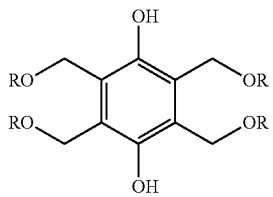

(3)

In the general formula (3), a plurality of R each independently represents an alkyl group (for example, an alkyl group having 1 to 10 carbon atoms). A plurality of R may be the same or different from each other.

In the general formula (1), the compound having a single bond as Z is a biphenol(dihydroxy biphenyl) derivative. Examples of the divalent organic group represented by Z include: an alkylene group having 1 to 10 carbon atoms such as a methylene group, an ethylene group or a propylene group; an alkylidene group having 2 to 10 carbon atoms such as an ethylidene group; an arylene group having 6 to 30 carbon atoms such as a phenylene group; a group obtained by substituting a part or all of hydrogen atom of these hydrocarbon groups with a halogen atom such as fluorine atom; a sulfonyl group; a carbonyl group; an ether bond; a sulfide bond; and an amide bond. Among these, Z is preferably a divalent organic group represented by the following general formula (4).

[Chemical Formula 8]

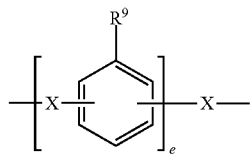

(4)

In the general formula (4), X represents: a single bond; an alkylene group (for example, an alkylene group having 1 to 10 carbon atoms); an alkylidene group (for example, an alkylidene group having 2 to 10 carbon atoms); a group obtained by substituting a part or all of hydrogen atom of these groups with a halogen atom; a sulfonyl group; a carbonyl group; an ether bond; a sulfide bond; or an amide bond. $R^9$ represents a hydrogen atom, a hydroxyl group, an alkyl group (for example, an alkyl group having 1 to 10 carbon atoms) or a haloalkyl group, and e represents an integer of 1 to 10. A plurality of $R^9$ and X may be the same or different from each other. Herein, the haloalkyl group means an alkyl group substituted with a halogen atom.

Specifically, the compound having an alkoxy methylamino group is preferably at least one selected from the group consisting of a compound represented by the following general formula (5) and a compound represented by the following general formula (6).

[Chemical Formula 9]

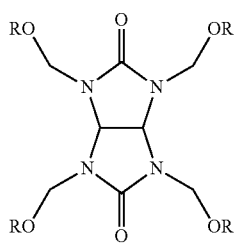

(5)

In the general formula (5), a plurality of R each independently represents an alkyl group (for example, an alkyl group having 1 to 10 carbon atoms). A plurality of R may be the same or different from each other.

[Chemical Formula 10]

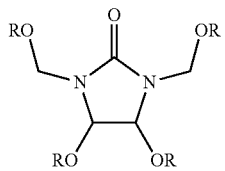

(6)

In the general formula (6), a plurality of R each independently represents an alkyl group (for example, an alkyl group having 1 to 10 carbon atoms). A plurality of R may be the same or different from each other.

Examples of the compound having a hydroxymethylamino group include (poly)(N-hydroxymethyl)melamine, (poly)(N-hydroxymethyl)glycoluril, (poly)(N-hydroxymethyl)benzoguanamine, and (poly)(N-hydroxymethyl)urea. Examples of the compound having an alkoxy methylamino group include nitrogen-containing compounds of which a part or all of the methylol groups of the compound having a hydroxymethylamino group are alkyletherified. Herein, examples of the alkyl group of the alkyl ether include a methyl group, an ethyl group, a butyl group and a mixture thereof, and it may contain an oligomer component formed by partial self-condensation. Specific examples of the compound having an alkoxy methylamino group include hexakis(methoxymethyl)melamine, hexakis(butoxymethyl)melamine, tetrakis(methoxymethyl)glycoluril, tetrakis(butoxymethyl)glycoluril, and tetrakis(methoxymethyl)urea.

The content of the component (C) may be 5 parts by mass or more, 10 parts by mass or more, 15 parts by mass or more, 20 parts by mass or more, or 25 parts by mass or more with respect to 100 parts by mass of the component (A) from the viewpoint that chemical resistance and heat resistance tend to be excellent. The content of the component (C) may be 80 parts by mass or less, 70 parts by mass or less, 55 parts by mass or less, or 40 parts by mass or less with respect to 100 parts by mass of the component (A) from the viewpoint that resolution tends to be more excellent.

(Component (D))

The photosensitive resin composition of the present embodiment comprises an aliphatic compound having two or more functional groups, the functional groups being at least one functional group selected from the group consisting of an acryloyloxy group, a methacryloyloxy group, a glycidyloxy group, an oxetanyl alkyl ether group, a vinyl ether group and a hydroxyl group as the component (D). The component (D) may have at least one each of two or more types of different functional groups, and may have two or more of one type of functional group. The compound is preferably an aliphatic compound having three or more of the above-mentioned functional groups. The upper limit of the number of the functional groups is not particularly limited, and is, for example, 12. The "aliphatic compound" means a compound having an aliphatic skeleton as a main skeleton and containing no aromatic ring and no aromatic heterocycle.

From the viewpoint of excellent workability in forming the photosensitive resin composition layer (photosensitive layer) on a substrate, a photosensitive resin composition can be also required to be excellent in stickiness (tackiness) to the substrate. In using a photosensitive resin composition not having sufficient tackiness, the photosensitive resin composition in an exposed part is easily removed by a developing treatment, so that the adhesion between the substrate and a resin pattern (resist pattern) tends to be deteriorated. In the present embodiment, the photosensitive resin composition comprises the component (D), which tends to provide an improvement in adhesion (that is, tackiness) between the photosensitive resin composition and the substrate. Further, the photosensitive resin composition comprises the component (D), which can apply flexibility to the photosensitive layer (coating film), and tends to increase the dissolution rate of an unexposed part in development with an alkali aqueous solution to improve the resolution of the resin pattern. From the viewpoints of further excellent tackiness and solubility in an alkali aqueous solution, the weight average molecular weight of the component (D) may be 92 to 2000, 106 to 1500, or 134 to 1300 in consideration of the balance. When it is difficult for the above-mentioned method to measure the weight average molecular weight of a compound having a low molecular weight, the molecular weight can be measured by other methods, followed by calculating the average.

Specific examples of the component (D) include compounds represented by the following general formulae (7) to (10). In the following general formulae (7) to (13), examples of an alkyl group in the oxetanyl alkyl ether group include a methyl group, an ethyl group and a propyl group, and a methyl group is preferred.

[Chemical Formula 11]

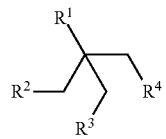

(7)

In the general formula (7), $R^1$ represents a hydrogen atom, a methyl group, an ethyl group, a hydroxyl group, or a group represented by the following general formula (11); and $R^2$, $R^3$ and $R^4$ each independently represent an acryloyloxy group, a methacryloyloxy group, a glycidyloxy group, an oxetanyl alkyl ether group, a vinyl ether group, a hydroxyl group, a group represented by the following general formula (12), or a group represented by the following general formula (13).

[Chemical Formula 12]

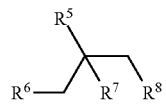

(8)

In the general formula (8), $R^5$ represents a hydrogen atom, a methyl group, an ethyl group, a hydroxyl group, or a group represented by the following general formula (11); and $R^6$, $R^7$ and $R^8$ each independently represent an acryloyloxy group, a methacryloyloxy group, a glycidyloxy group, an oxetanyl alkyl ether group, a vinyl ether group, a hydroxyl group, a group represented by the following general formula (12), or a group represented by the following general formula (13).

[Chemical Formula 13]

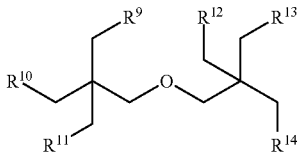

(9)

In the general formula (9), $R^9$, $R^{10}$, $R^{11}$, $R^{12}$, $R^{13}$ and $R^{14}$ each independently represent an acryloyloxy group, a methacryloyloxy group, a glycidyloxy group, an oxetanyl alkyl ether group, a vinyl ether group, a hydroxyl group, a group represented by the following general formula (12), or a group represented by the following general formula (13).

[Chemical Formula 14]

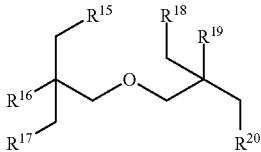

(10)

In the general formula (10), $R^{15}$, $R^{17}$, $R^{18}$ and $R^{20}$ each independently represent an acryloyloxy group, a methacryloyloxy group, a glycidyloxy group, an oxetanyl alkyl ether group, a vinyl ether group, a hydroxyl group, a group represented by the following general formula (12), or a group represented by the following general formula (13); and $R^{16}$ and $R^{19}$ each independently represent a hydrogen atom, a methyl group, an ethyl group, a hydroxyl group, or a group represented by the following general formula (11).

[Chemical Formula 15]

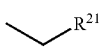

(11)

In the general formula (11), $R^{21}$ represents an acryloyloxy group, a methacryloyloxy group, a glycidyloxy group, an oxetanyl alkyl ether group, a vinyl ether group or a hydroxyl group.

[Chemical Formula 16]

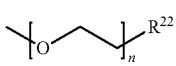

(12)

In the general formula (12), $R^{22}$ represents an acryloyloxy group, a methacryloyloxy group, a glycidyloxy group, an oxetanyl alkyl ether group, a vinyl ether group or a hydroxyl group, and n is an integer of 1 to 10.

[Chemical Formula 17]

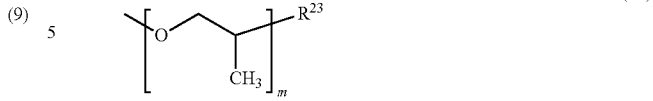

(13)

In the general formula (13), R represents an acryloyloxy group, a methacryloyloxy group, a glycidyloxy group, an oxetanyl alkyl ether group, a vinyl ether group or a hydroxyl group, and m each is an integer of 1 to 10.

Specifically, the component (D) is preferably a compound having at least one selected from the group consisting of an acryloyloxy group, a methacryloyloxy group, a glycidyloxy group, an oxetanyl alkyl ether group and a vinyl ether group, more preferably a compound having two or more glycidyloxy groups or two or more acryloyloxy groups, and still more preferably a compound having three or more glycidyloxy groups or three or more acryloyloxy groups, from the viewpoint of further improving sensitivity and resolution. One of the component (D) can be used singly, or a mixture of two or more thereof can be used.

As the component (D), it is possible to use at least one selected from the group consisting of a compound having an acryloyloxy group, a compound having a methacryloyloxy group, a compound having a glycidyloxy group, a compound having an oxetanyl alkyl ether group, a compound having a vinyl ether group, and a compound having a hydroxyl group. The component (D) is preferably a compound having at least one group selected from the group consisting of an acryloyloxy group, a methacryloyloxy group and a glycidyloxy group, and more preferably a compound having at least one group selected from the group consisting of an acryloyloxy group and a methacryloyloxy group from the viewpoint of improving insulation reliability in fine wiring. From the viewpoint of further excellent developability, the component (D) is preferably an aliphatic compound having two or more glycidyloxy groups, more preferably an aliphatic compound having three or more glycidyloxy groups, and still more preferably an aliphatic compound having three or more glycidyloxy groups and having a weight average molecular weight of 1000 or less.

Examples of the compound having an acryloyloxy group include EO-modified dipentaerythritol hexaacrylate, PO-modified dipentaerythritol hexaacrylate, dipentaerythritol hexaacrylate, EO-modified ditrimethylolpropane tetraacrylate, PO-modified ditrimethylolpropane tetraacrylate, ditrimethylolpropane tetraacrylate, EO-modified pentaerythritol tetraacrylate, PO-modified pentaerythritol tetraacrylate, pentaerythritol tetraacrylate, EO-modified pentaerythritol triacrylate, PO-modified pentaerythritol triacrylate, pentaerythritol triacrylate, EO-modified trimethylolpropane acrylate, PO-modified trimethylolpropane acrylate, trimethylolpropane acrylate, EO-modified glycerol triacrylate, PO-modified glycerol triacrylate, and glycerol triacrylate. One of the compounds having an acryloyloxy group can be used singly, or a mixture of two or more thereof can be used.

Examples of the compound having a methacryloyloxy group include EO-modified dipentaerythritol hexamethacrylate, PO-modified dipentaerythritol hexamethacrylate, dipentaerythritol hexamethacrylate, EO-modified ditrimethylolpropane tetramethacrylate, PO-modified ditrimethylolpropane tetramethacrylate, ditrimethylolpropane tetramethacrylate, EO-modified pentaerythritol tetramethacrylate, PO-modified pentaerythritol tetramethacrylate, pentaerythritol tetramethacrylate, EO-modified pentaerythritol trimethacrylate, PO-modified pentaerythritol trimethacrylate, pentaerythritol trimethacrylate, EO-modified trimethylolpropane methacrylate, PO-modified trimethylolpropane methacrylate, trimethylolpropane methacrylate, EO-modified glycerol trimethacrylate, PO-modified glycerol trimethacrylate, and glycerol trimethacrylate. One of the compounds having a methacryloyloxy group can be used singly, or a mixture of two or more thereof can be used.

Examples of the compound having a glycidyloxy group include ethylene glycol diglycidyl ether, diethylene glycol diglycidyl ether, propylene glycol diglycidyl ether, tripropylene glycol diglycidyl ether, neopentyl glycol diglycidyl ether, 1,6-hexanediol diglycidyl ether, glycerol diglycidyl ether, dipentaerythritol hexaglycidyl ether, pentaerythritol tetraglycidyl ether, pentaerythritol triglycidyl ether, trimethylolethane triglycidyl ether, trimethylolpropane triglycidyl ether, glycerol polyglycidyl ether, glycerol triglycidyl ether, glycerol propoxylate triglycidyl ether, 1,4-cyclohexanedimethanol diglycidyl ether, and diglycidyl 1,2-cyclohexanedicarboxylate. One of the compounds having a glycidyloxy group can be used singly, or a mixture of two or more thereof can be used.

The compound having a glycidyloxy group is particularly preferably at least one selected from the group consisting of dipentaerythritol hexaglycidyl ether, pentaerythritol tetraglycidyl ether, pentaerythritol triglycidyl ether, trimethylolethane triglycidyl ether, trimethylolpropane triglycidyl ether, glycerol polyglycidyl ether, and glycerol triglycidyl ether.

Commercially available examples of the compound having a glycidyloxy group include EPOLIGHT 40E, EPOLIGHT 100E, EPOLIGHT 70P, EPOLIGHT 200P, EPOLIGHT 1500NP, EPOLIGHT 1600, EPOLIGHT 80MF, and EPOLIGHT 100MF (all the above manufactured by Kyoeisha Chemical Co., Ltd., trade names), an alkyl-type epoxy resin ZX-1542 (manufactured by Nippon Steel and Sumikin Chemical Co., Ltd., trade name), DENACOL EX-212L, DENACOL EX-214L, DENACOL EX-216L, DENACOL EX-321L, and DENACOL EX-850L (all the above manufactured by Nagase ChemteX Corporation, trade names, "DENACOL" is registered trademark).

Examples of the compound having an oxetanyl alkyl ether group include a compound having a 3-alkyl-3-oxetanyl alkyl ether group, and a compound having a 3-ethyl-3-oxetanyl alkyl ether group is preferred. Examples of such an oxetane compound include dipentaerythritol hexakis(3-ethyl-3-oxetanylmethyl)ether, pentaerythritol tetrakis(3-ethyl-3-oxetanylmethyl)ether, pentaerythritol tris(3-ethyl-3-oxetanylmethyl)ether, trimethylol ethane tris(3-ethyl-3-oxetanylmethyl)ether, trimethylol propane tris(3-ethyl-3-oxetanylmethyl)ether, glycerol poly(3-ethyl-3-oxetanylmethyl)ether, and glycerol tris(3-ethyl-3-oxetanylmethyl)ether. One of the compounds having oxetanyl alkyl ether can be used singly, or a mixture of two or more thereof can be used.

Examples of the compound having a hydroxyl group include polyalcohols such as dipentaerythritol, pentaerythritol and glycerol. One of the compounds having a hydroxyl group can be used singly, or a mixture of two or more thereof can be used.

In the component (D), at least one selected from the group consisting of trimethylolethane triglycidyl ether and trimethylolpropane triglycidyl ether is preferred from the viewpoints of further excellent sensitivity and resolution.

The component (D) is commercially available as an alkyl-type epoxy resin (manufactured by Nippon Steel and Sumikin Chemical Co., Ltd., trade name ZX-1542), an alkyl-type acrylic resin (manufactured by Nippon Kayaku Co., Ltd., trade name PET-30) and the like.

The content of the component (D) may be 1 part by mass or more, 10 parts by mass or more, 20 parts by mass or more, 25 parts by mass or more, 30 parts by mass or more, or 40 parts by mass or more with respect to 100 parts by mass of the component (A) from the viewpoint of being capable of further applying flexibility to the photosensitive layer (coating film), and from the viewpoint of further increasing the dissolution rate of an unexposed part in development with an alkali aqueous solution easily. The content of the component (D) may be 70 parts by mass or less, 65 parts by mass or less, or 50 parts by mass or less with respect to 100 parts by mass of the component (A) from the viewpoint of tending to easily form a film on a desired support using the photosensitive resin composition.

(Component (E))

The photosensitive resin composition of the present embodiment may further comprise a sensitizer as the component (E). When the photosensitive resin composition comprises the component (E), it is possible to further improve the sensitivity of the photosensitive resin composition. Examples of the sensitizer include 9,10-dibutoxyanthracene. One of the component (E) can be used singly, or a mixture of two or more thereof can be used.

The content of the component (E) may be 0.01 to 1.5 parts by mass or 0.05 to 0.5 parts by mass with respect to 100 parts by mass of the component (A).

(Component (F))

The photosensitive resin composition of the present embodiment can further comprise a solvent as the component (F), in order to improve the handling properties of the photosensitive resin composition or in order to adjust the viscosity and the storage stability. The component (F) is preferably an organic solvent. The organic solvent is not particularly limited as long as capable of exhibiting the above-mentioned performance, and examples thereof include: ethylene glycol monoalkyl ether acetates such as ethylene glycol monomethyl ether acetate and ethylene glycol monoethyl ether acetate; propylene glycol monoalkyl ethers such as propylene glycol monomethyl ether, propylene glycol monoethyl ether, propylene glycol monopropyl ether, and propylene glycol monobutyl ether, propylene glycol dialkyl ethers such as propylene glycol dimethyl ether, propylene glycol diethyl ether, propylene glycol dipropyl ether, and propylene glycol dibutyl ether, propylene glycol monoalkyl ether acetates such as propylene glycol monomethyl ether acetate, propylene glycol monoethyl ether acetate, propylene glycol monopropyl ether acetate, and propylene glycol monobutyl ether acetate; cellosolves such as ethyl cellosolve and butyl cellosolve; carbitols such as butyl carbitol; lactic acid esters such as methyl lactate, ethyl lactate, n-propyl lactate, and isopropyl lactate; aliphatic carboxylates such as ethyl acetate, n-propyl acetate, isopropyl acetate, n-butyl acetate, isobutyl acetate, n-amyl acetate, isoamyl acetate, isopropyl propionate, n-butyl propionate, and isobutyl propionate; esters such as methyl 3-methoxypropionate, ethyl 3-methoxypropionate, methyl 3-ethoxypropionate, ethyl 3-ethoxypropionate, methyl pyruvate, and ethyl pyruvate; aromatic hydrocarbons such as toluene and xylene; ketones such as methyl ethyl ketone (alias name: 2-butanone), 2-heptanone, 3-heptanone, 4-heptanone, and cyclohexanone; amides such as N,N-dimethylformamide, N-methylacetamide, N,N-dimethylacetamide, and N-methylpyrrolidone; and lactones such as γ-butyrolactone. One of the component (F) can be used singly, or a mixture of two or more thereof can be used.

The content of the component (F) may be 30 to 200 parts by mass or 40 to 120 parts by mass with respect to 100 parts by mass of the total amount of the photosensitive resin composition (excluding the component (F) when the component (F) is used).

(Component (G))

The photosensitive resin composition of the present embodiment may comprise a compound having a Si—O bond (excluding the compounds corresponding to the components (A) to (F)) as the component (G). The compound having a Si—O bond may be a compound having a siloxane bond. The component (G) is not particularly limited as long as having a Si—O bond, and examples thereof include silica (silica filler) and a silane compound (silane coupling agent and the like). One of the component (G) can be used singly, or a mixture of two or more thereof can be used.

The photosensitive resin composition of the present embodiment comprises an inorganic filler, which can provide a decrease in the thermal expansion coefficient of the resin pattern. In using the inorganic filler as the component (G), the inorganic filler is preferably silica such as fused spherical silica, fused crushed silica, fumed silica or sol-gel silica. The inorganic filler may have a Si—O bond by treating an inorganic filler with the silane compound. Among the inorganic fillers treated with the silane compound, examples of the inorganic filler other than silica include aluminum oxide, aluminum hydroxide, calcium carbonate, calcium hydroxide, barium sulfate, barium carbonate, magnesium oxide, magnesium hydroxide, or inorganic fillers derived from mineral resources such as talc and mica.

The inorganic filler has an average primary particle diameter of preferably 100 nm or less, more preferably 80 nm or less, and still more preferably 50 nm or less from the viewpoint of further excellent photosensitivity of the photosensitive layer. When the average primary particle diameter is 100 nm or less, the photosensitive resin composition hardly becomes cloudy, so that the exposure light is easily transmitted through the photosensitive layer. Consequently, the unexposed part is easily removed, so that the resolution of the resin pattern tends to hardly decrease. The average primary particle diameter is a value obtained by conversion from the BET specific surface area.

The thermal expansion coefficient of silica is preferably $5.0 \times 10^{-6}/°C$. or less. From the viewpoint of easily obtaining a suitable particle diameter, silica such as fused spherical silica, fumed silica or sol-gel silica is preferred, and fumed silica or sol-gel silica is more preferred. Silica is preferably silica (nanosilica) having an average primary particle diameter of 5 to 100 nm.

In measuring the particle diameter of the inorganic filler, it is possible to use a known particle size analyzer. Examples of the particle size analyzer include: a laser diffraction scattering particle size analyzer which obtains particle size distribution by calculation based on the intensity distribution pattern of diffracted light and scattered light emitted from particles irradiated with laser beams; and a nanoparticle size analyzer which obtains particle size distribution using frequency analysis by a dynamic light scattering method.

When the photosensitive resin composition of the present embodiment comprises the silane compound, it is possible to allow the adhesion strength between the photosensitive layer and the substrate to be improved after the formation of the pattern. In using the silane compound as the component (G), the silane compound is not particularly limited as long as having a Si—O bond. Examples of the silane compound include alkylsilane, alkoxysilane, vinylsilane, epoxysilane, aminosilane, acrylicsilane, methacrylsilane, mercaptosilane, sulfide silane, isocyanate silane, sulfur silane, styrylsilane, and alkylchlorosilane.

The silane compound as the component (G) is preferably a compound represented by the following general formula (14).

(14)

In the general formula (14), $R^{101}$ represents an alkyl group having 1 to 10 carbon atoms such as a methyl group, an ethyl group or a propyl group; $R^{102}$ represents a monovalent organic group; and f represents an integer of 0 to 3. When f is 0, 1 or 2, a plurality of $R^{101}$ may be the same or different from each other. When f is 2 or 3, a plurality of $R^{102}$ may be the same or different from each other. From the viewpoint of further excellent resolution, $R^{101}$ is preferably an alkyl group having 1 to 5 carbon atoms, and more preferably an alkyl group having 1 to 2 carbon atoms. When the treatment with a silane compound (compound represented by the general formula (14), and the like) is performed in order to improve the dispersibility of the inorganic filler, from the viewpoint of further improving the dispersibility of the inorganic filler, f is preferably 0 to 2, and more preferably 0 to 1.

Specific examples of the silane compound as the component (G) include methyltrimethoxysilane, dimethyldimethoxysilane, trimethylmethoxysilane, methyltriethoxysilane, methyltriphenoxysilane, ethyltrimethoxysilane, n-propyltrimethoxysilane, diisopropyldimethoxysilane, isobutyltrimethoxysilane, diisobutyldimethoxysilane, isobutyltriethoxysilane, n-hexyltrimethoxysilane, n-hexyltriethoxysilane, cyclohexylmethyldimethoxysilane, n-octyltriethoxysilane, n-dodecyltrimethoxysilane, phenyltrimethoxysilane, diphenyldimethoxysilane, triphenylsilanol, tetraethoxysilane, 3-aminopropyltrimethoxysilane, 3-aminopropyltriethoxysilane, 3-(2-aminoethyl)aminopropyltrimethoxysilane, 3-(2-aminoethyl)aminopropylmethyldimethoxysilane, 3-phenylaminopropyltrimethoxysilane, 3-glycidoxypropyltrimethoxysilane, 3-glycidoxypropylmethyldimethoxysilane, 3-glycidoxypropyltriethoxysilane, 3-glycidoxypropylmethyldiethoxysilane, bis(3-(triethoxysilyl)propyl)disulfide, bis(3-(triethoxysilyl)propyl)tetrasulfide, vinyltriacetoxysilane, vinyltrimethoxysilane, vinyltriethoxysilane, vinyltriisopropoxysilane, allyltrimethoxysilane, 3-methacryloyloxypropyltrimethoxysilane, 3-methacryloyloxypropylmethyldimethoxysilane, 3-methacryloyloxypropyltriethoxysilane, 3-mercaptopropyltrimethoxysilane, 3-mercaptopropylmethyldimethoxysilane, 3-mercaptopropyltriethoxysilane, and N-(1,3-dimethylbutylidene)-3-aminopropyltriethoxysilane. The component (G) is preferably an epoxysilane having one or more glycidyloxy groups, and more preferably an epoxysilane having at least one selected from the group consisting of a trimethoxysilyl group and a triethoxysilyl group.

The content of the component (G) is preferably 1.8 to 420 parts by mass, and more preferably 1.8 to 270 parts by mass with respect to 100 parts by mass of the component (A). The content of the component (G) may be 1 to 20 parts by mass, and may be 3 to 10 parts by mass with respect to 100 parts by mass of the component (A).

(Other Components)

The photosensitive resin composition of the present embodiment may comprise a low-molecular weight phenol compound having a molecular weight of less than 1000 (hereinafter referred to as a "phenol compound (a)") in addition to the component (A). Examples of the phenol compound (a) include 4,4'-dihydroxydiphenylmethane, 4,4'- dihydroxydiphenyl ether, tris(4-hydroxyphenyl)methane, 1,1-bis(4-hydroxyphenyl)-1-phenylethane, tris(4-hydroxyphenyl)ethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methylethyl]-1,3-dihydroxybenzene, 1,1-bis(4-hydroxyphenyl)-1-[4-{1-(4-hydroxyphenyl)-1-methylethyl}phenyl]ethane, and 1,1,2,2-tetra(4-hydroxyphenyl)ethane. The content of the phenol compound (a) is in the range of, for example, 0 to 40 parts by mass (particularly, 0 to 30 parts by mass), with respect to 100 parts by mass of the component (A).

The photosensitive resin composition of the present embodiment may comprise components other than the components described above. Examples of other components include a colorant, an adhesion aid, a leveling agent, and an inorganic filler having no Si—O bond. Examples of the inorganic filler include, but are not particularly limited to, an aluminum compound such as aluminum oxide or aluminum hydroxide; an alkali metal compound; an alkali earth metal compound such as calcium carbonate, calcium hydroxide, barium sulfate, barium carbonate, magnesium oxide, or magnesium hydroxide; and an inorganic compound derived from mineral resources. These can be crushed by a crusher, and classified in some cases, to disperse with a maximum particle diameter of 2 μm or less. One of the inorganic fillers may be used singly, or a mixture of two or more thereof may be used. Any of the inorganic fillers is preferably dispersed in the photosensitive resin composition with a maximum particle diameter of 2 μm or less. On this occasion, in order to achieve dispersion in the resin without aggregation, a silane coupling agent can be used. The content of the inorganic filler is preferably 1 to 70 mass %, and more preferably 3 to 65 mass %, based on the total amount of the photosensitive resin composition (excluding the component (F) when the component (F) is used).

<Photosensitive Element>

Subsequently, the photosensitive element of the present embodiment will be described.

As shown in FIG. 1, a photosensitive element 11 of the present embodiment comprises a support 9 and a photosensitive layer 2 provided on the support 9, and the photosensitive layer 2 comprises the photosensitive resin composition of the present embodiment. The photosensitive layer 2 is formed by using the photosensitive resin composition of the present embodiment. The photosensitive element 11 of the present embodiment may further comprise a protective layer 10 for covering the photosensitive layer 2 on the photosensitive layer 2. The photosensitive element 11 of the present embodiment can be used for a method for producing a circuit substrate of the present embodiment.

As the support, it is possible to use a polymer film having heat resistance and solvent resistance such as polyester (polyethylene terephthalate and the like), polypropylene or polyethylene. The thickness of the support (polymer film) is preferably 5 to 25 μm. One of the polymer films may be used as a support and the other one as a protective layer, so as to be laminated on each surface of the photosensitive layer. That is, the polymer film may be laminated on each surface of the photosensitive layer so as to sandwich the photosensitive layer.

As the protective layer, it is possible to use a polymer film having heat resistance and solvent resistance such as polyester (polyethylene terephthalate and the like), polypropylene or polyethylene.

The photosensitive layer can be formed by applying the photosensitive resin composition on the support or the protective layer. Examples of the applying method include dipping, spraying, bar coating, roll coating and spin coating. Although the thickness of the photosensitive layer is different according to the use, the dried photosensitive layer has a thickness of preferably 1 to 100 μm, more preferably 3 to 60 μm, still more preferably 5 to 60 μm, particularly preferably 5 to 40 μm, and extremely preferably 5 to 25 μm. From the viewpoints of excellent insulation reliability and productivity in mounting a chip, the thickness of the photosensitive layer is preferably more than 20 μm, but it may be 20 μm or less.

<Method for Forming Resist Pattern and Method for Producing Circuit Substrate>

Subsequently, a method for forming a resist pattern of the present embodiment (first embodiment and second embodiment) will be described. The method for forming a resist pattern of the first embodiment comprises: a photosensitive layer preparing step of forming a photosensitive layer comprising the photosensitive resin composition on a substrate (for example, a baseplate); an exposing step of exposing the photosensitive layer in order to form a predetermined pattern; a developing step of developing the photosensitive layer after the exposing step to obtain a resin pattern; and a heat-treating step of heat-treating the resin pattern. The method for forming a resist pattern of the second embodiment comprises: a photosensitive layer preparing step of disposing the photosensitive layer of the photosensitive element on a substrate; an exposing step of exposing the photosensitive layer in order to form a predetermined pattern; a developing step of developing the photosensitive layer after the exposing step to obtain a resin pattern; and a heat-treating step of heat-treating the resin pattern. The resist pattern of the present embodiment is the resist pattern obtained by the method for forming a resist pattern of the present embodiment.

The photosensitive layer preparing step in the method for forming a resist pattern of the first embodiment is, for example, a step of applying the photosensitive resin composition on a substrate (for example, a baseplate) and drying the photosensitive resin composition to form a photosensitive layer. The photosensitive layer preparing step in the method for forming a resist pattern of the second embodiment is, for example, a step of disposing the photosensitive layer on a substrate (for example, a baseplate) using the photosensitive element. The photosensitive layer preparing step can also be considered as a step of obtaining a substrate (for example, a baseplate) including a photosensitive layer comprising a photosensitive resin composition. The method for forming a resist pattern of the present embodiment may further comprise a step of heat-treating (post-exposure baking) the photosensitive layer between the exposing step and the developing step. In this case, the method for forming a resist pattern of the present embodiment comprises: a step of exposing the photosensitive layer in order to form a predetermined pattern and performing a post-exposure heat treatment (post-exposure baking); and a step of developing the photosensitive layer after the heat treatment (post-exposure baking) and heat-treating the obtained resin pattern. Hereinafter, the steps will be further described.

In the method for forming a resist pattern of the present embodiment, for example, first, a photosensitive layer comprising the above-mentioned photosensitive resin composition is formed on a substrate on which a resist pattern is to be formed. Examples of the method for forming the photosensitive layer include: a method for applying (coating) the photosensitive resin composition to a substrate and drying so as to evaporate the solvent and the like to form a photosensitive layer (coating film); and a method for transferring (laminating) the photosensitive layer of the above-mentioned photosensitive element onto a substrate.

Examples of the substrate include a baseplate. Examples of the substrate for use include a copper foil coated with a resin, a copper-clad laminate, a silicon wafer having a metal-sputtered film, a silicon wafer having a copper plating film, and an alumina baseplate. A surface on which a photosensitive layer is formed in the substrate may be a cured resin layer formed by using a photosensitive resin composition. This tends to provide an improvement in the adhesion with the substrate.

Examples of the method for use in applying the photosensitive resin composition to a substrate include an application method such as dipping, spraying, bar coating, roll coating, or spin coating. The thickness of the coating film can be appropriately controlled by adjusting applying means, and the solid content concentration and viscosity of the photosensitive resin composition.

Subsequently, the photosensitive layer is exposed to a predetermined pattern through a predetermined mask pattern. Examples of the active rays for use in exposure include rays from a g-line stepper as a light source; ultraviolet rays from a low pressure mercury lamp, a high pressure mercury lamp, a metal halide lamp, an i-line stepper or the like as a light source; electron beams; and laser beams. The exposure amount is appropriately selected depending on the light source used, the thickness of a photosensitive layer, and the like. The exposure amount may be, for example, about 100 to 3000 $mJ/cm^2$ for a photosensitive layer having thickness of 5 to 50 μm in a case of ultraviolet irradiation from a high pressure mercury lamp. The exposure amount may be about 100 to 5000 $mJ/cm^2$ for a photosensitive layer having thickness of 10 to 50 μm in a case of ultraviolet irradiation from a high pressure mercury lamp.

Further, a heat treatment (post-exposure baking) may be performed before development after exposure. The post-exposure baking can accelerate the curing reaction between the component (A) and the component (C) due to the acid generated from the photosensitive acid generator. Although the conditions for the post-exposure baking are different depending on the composition of the photosensitive resin composition, the content of each component, the thickness of the photosensitive layer, and the like, for example, heating at 50 to 150° C. for 1 to 60 minutes is preferred, and heating at 60 to 100° C. for 1 to 15 minutes is more preferred. Heating may be performed at 70 to 150° C. for 1 to 60 minutes, and heating may be performed at 80 to 120° C. for 1 to 60 minutes.

Subsequently, the photosensitive layer subjected to exposure and/or post-exposure baking is developed in an alkali developer to dissolve and remove a region of an unexposed part (a region other than a cured part), so that a desired resist pattern is obtained. Examples of the development method in this case include shower developing, spray developing, dip developing, and paddle developing. Development conditions are, for example, at 20 to 40° C. for 10 to 300 seconds in the spray developing.

Examples of the alkali developer include an alkali aqueous solution obtained by dissolving an alkali compound such as sodium hydroxide, potassium hydroxide, tetramethylammonium hydroxide or choline in water at a concentration of 1 to 10 mass %; and an aqueous ammonia solution. A water-soluble organic solvent such as methanol or ethanol, a surfactant and the like in an appropriate amount can be added to the alkali developer. After development with the alkali developer, washing with water and drying are performed. Tetramethylammonium hydroxide is preferred as the alkali developer, from the viewpoint of further excellent resolution.

Further, by performing a heat treatment for exhibiting insulating film properties, a cured film (resist pattern) of the photosensitive resin composition is obtained. The curing conditions of the photosensitive resin composition are not particularly limited, and can be adjusted depending on the use of the cured product. The photosensitive resin composition can be cured by heating, for example, at 50 to 250° C. for 30 minutes to 10 hours.

Heating can be performed in two stages for sufficient progress of curing and/or prevention of deformation of the obtained shape of a resin pattern. For example, curing can be performed by heating at 50 to 120° C. for 5 minutes to 2 hours in a first stage, and at 80 to 200° C. for 10 minutes to 10 hours in a second stage. When the heat treatment is performed in the above-mentioned curing conditions, heating facilities are not particularly limited, and common ovens, infrared furnaces and the like can be used.

Subsequently, a method for producing a circuit substrate of the present embodiment will be described. The method for producing a circuit substrate of the present embodiment is a method for producing a circuit substrate including a resin pattern and a conductor pattern. The method for producing a circuit substrate of the present embodiment comprises: a conductor layer forming step of subjecting at least a part of an exposed part of the resin pattern after the heat-treating step in the method for forming a resist pattern of the present embodiment, and at least a part of an exposed part of the substrate to a plating treatment, to form a conductor layer; and a conductor pattern forming step of removing a part of the conductor layer to form a conductor pattern. The circuit substrate (for example, circuit board) of the present embodiment is a circuit substrate obtained by the method for producing a circuit substrate of the present embodiment. The circuit substrate of the present embodiment includes the resin pattern (resist pattern) and the conductor pattern.

In the use which includes the fabrication of an advanced electronic package requiring a high-density interconnected body, the formation of a fine conductor pattern of 10 μm or less is required to be allowed. The method for producing a circuit substrate of the present embodiment makes it possible to form the resin pattern (resist pattern) having sufficient adhesion between the resin pattern and the conductor pattern, which allows a conductor pattern of 10 μm or less to be formed.

The method for producing the circuit substrate including the resin pattern and the conductor pattern makes it possible to obtain a circuit substrate having a finer conductor pattern than that of a conventional method and having excellent electrical properties. The present inventors consider that this is because the peeling of the conductor pattern hardly occurs due to the existence of the resin pattern. A curing reaction in a portion remaining as the resin pattern after development is accelerated by performing a heat treatment before development after exposure, which tends to more easily form a finer conductor pattern.

In the conductor layer forming step, a conductor layer is formed in a region (at least a part of the exposed part of the resin pattern and at least a part of the exposed part of the substrate) subjected to a plating treatment. The conductor layer forming step may include a step of performing electrolytic plating (electroplating) after performing electroless plating, to form the conductor layer, or may include a step of performing electrolytic plating after performing sputtering, to form the conductor layer.

The conductor pattern forming step may include a step of removing a part of the conductor layer by etching, to form the conductor pattern, or may include a step of removing a part of the conductor layer by polishing, to form the conductor pattern.

Figure 2:
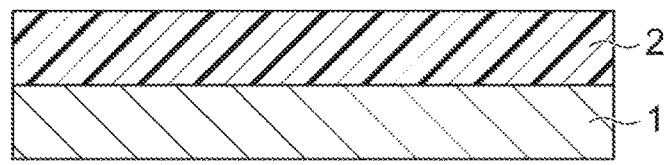
FIG. 2 is a schematic sectional view showing a method for producing a circuit substrate of the present embodiment.
Figure 2:
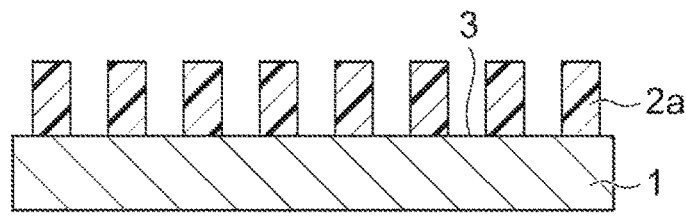
Figure 2:
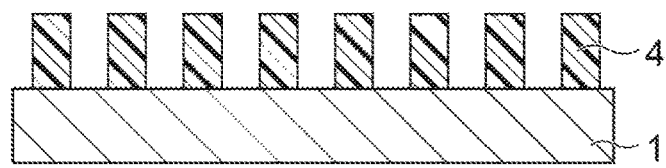
Figure 2:
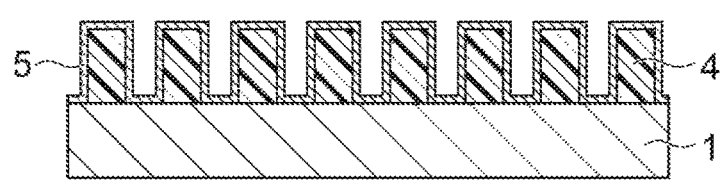
Figure 2:
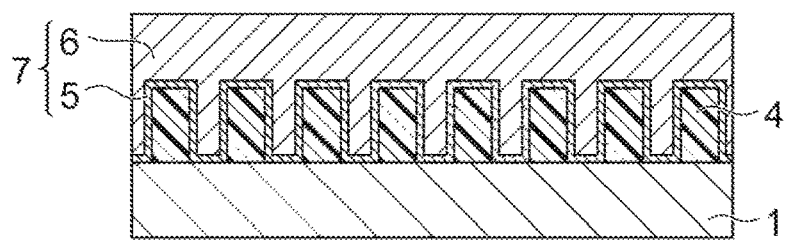
Figure 2:
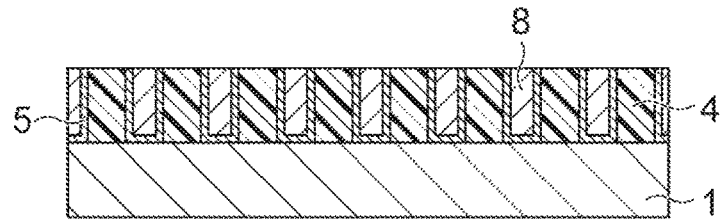

Hereinafter, one embodiment of the present disclosure will be specifically described with reference to FIG. 2, but the present disclosure is not limited thereto. FIG. 2 shows a method for producing a circuit board as an example of a method for producing a circuit substrate of the present embodiment.

The method for producing a circuit board of the present embodiment comprises steps of: (a) forming a photosensitive layer 2 comprising a photosensitive resin composition on a baseplate 1 (refer to FIG. 2(a)); (b) exposing the photosensitive layer 2 in order to form a predetermined pattern, and performing development and heat-treatment, to obtain a resin pattern 4 (refer to FIGS. 2(b) and 2(c)); (c) subjecting an exposed part of the baseplate 1 and an exposed part of the resin pattern 4 to a plating treatment to form a conductor layer 7 (refer to FIGS. 2(d) and 2(e)); and (d) removing a part of the conductor layer 7 to form a conductor pattern (circuit) 8 (refer to FIG. 2(f)). That is, the method for producing a circuit board of the present embodiment is a method for producing a circuit board including a resin pattern 4 formed using a predetermined pattern and a fine conductor pattern 8 on a baseplate 1. Herein, the resin pattern is a pattern of a resin obtained by curing a photosensitive layer on which a predetermined pattern is formed, and the resin in the resin pattern is partially or wholly cured.

In the step (b), a resin pattern 2a (a photosensitive layer 2 on which a predetermined pattern is formed) is obtained by developing the photosensitive layer 2 after exposure in an alkali developer to dissolve and remove a region (unexposed part) other than a portion cured by exposure (refer to FIG. 2(b)). The region removed herein is a region (circuit groove 3) on which the conductor pattern 8 is to be formed. Subsequently, the resin pattern 4 is obtained by heat-treating the resin pattern 2a (refer to FIG. 2(c)).

The exposed part of the baseplate 1 in the step (c) is a region in which the resin pattern 4 is not formed on a surface of the baseplate 1 on which the resin pattern 4 is formed.

A plating treatment method is not particularly limited, and may be a method using, for example, electrolytic plating, electroless plating, or sputtering.

The thickness of the conductor layer 7 can be appropriately adjusted by the height of a wiring groove to be formed, and preferably 1 to 35 μm, and more preferably 3 to 25 μm.

The conductor layer 7 may be composed of a seed metal layer 5 and a plating layer 6 grown thereon. That is, the step (c) may include a step of forming the seed metal layer 5 on the exposed part of the baseplate 1 and the exposed part of the resin pattern 4 (refer to FIG. 2(d)). In forming the seed metal layer 5, the plating layer 6 can be formed by subjecting the formed seed metal layer 5 to a plating treatment (refer to FIG. 2(e)).

Examples of a method for forming the seed metal layer 5 include, but are not particularly limited to, electroless plating and sputtering.

In forming the seed metal layer 5 by electroless plating, a metal consisting the seed metal layer 5 may be, for example, an elemental metal such as gold, platinum, silver, copper, aluminum, cobalt, chrome, nickel, titanium, tungsten, iron, tin or indium, or may be a solid solution (alloy) of two or more kinds of metals such as nickel-chrome alloy.

Among these, from the viewpoints of broad utility of metal film formation, cost, easiness of removal by etching, and the like, the metal consisting the seed metal layer 5 is preferably chrome, nickel, titanium, nickel-chrome alloy, aluminum, zinc, copper-nickel alloy, copper-titanium alloy, gold, silver or copper, more preferably chrome, nickel, titanium, nickel-chrome alloy, aluminum, zinc, gold, silver or copper, and still more preferably titanium or copper. The seed metal layer 5 may be a single layer, or may be a multilayer structure wherein two or more layers of different metal are laminated.

In forming the seed metal layer 5 by electroless plating, it is possible to use an electroless plating solution. As the electroless plating solution, it is possible to use a known self-catalyst type electroless plating solution. The type of metal, the type of reducing agent, the type of complexing agent, the concentration of hydrogen ions, the concentration of dissolved oxygen, and the like which are contained in the electroless plating solution are not particularly limited. As the electroless plating solution, for example, it is possible to use an electroless copper plating solution using ammonium hypophosphite, hypophosphorous acid, ammonium borohydride, hydrazine, formalin or the like as a reducing agent; an electroless nickel-phosphorus plating solution using sodium hypophosphite as a reducing agent; an electroless nickel-boron plating solution using dimethyl aminoborane as a reducing agent; an electroless palladium plating solution; an electroless palladium-phosphorus plating solution using sodium hypophosphite as a reducing agent; an electroless gold plating solution; an electroless silver plating solution; an electroless nickel-cobalt-phosphorus plating solution using sodium hypophosphite as a reducing agent; or the like.

The method for forming the seed metal layer 5 by electroless plating may be, for example, a method for adhering catalyst nuclei of silver, palladium, zinc, cobalt or the like to a portion on which the seed metal layer 5 is to be formed, and thereafter forming a metal thin film on the catalyst nuclei using the above-mentioned electroless plating solution.

The method for adhering the catalyst nuclei to the exposed part of the baseplate 1 and the exposed part of the resin pattern 4 is not particularly limited. Examples thereof include a method for preparing a solution in which a metal compound, salt or complex of a metal which serves as the catalyst nuclei is dissolved at a concentration of 0.001 to 10 mass % in water or an organic solvent (for example, alcohol and chloroform), immersing the baseplate 1 on which the resin pattern 4 is formed in the solution, and thereafter reducing the metal in the solution to deposit the metal. In the method, the solution can contain an acid, an alkali, a complexing agent, a reducing agent and the like, if necessary.

In forming the seed metal layer 5 by sputtering, as the metal consisting the seed metal layer 5, for example, the same metal as that when the seed metal layer 5 is formed by electroless plating can be used.

The metal consisting the plating layer 6 is not particularly limited, and preferably copper. Examples of a method for forming the plating layer 6 on the seed metal layer 5 include a method for growing plating by wet plating such as electrolytic plating.

In forming the seed metal layer 5, it is possible to subject the seed metal layer 5 to an antirust treatment using an antirust agent before forming the plating layer 6 after forming the seed metal layer 5.

In forming the seed metal layer 5, the thickness of the seed metal layer 5 is not particularly limited, and preferably 10 to 5000 nm, more preferably 20 to 2000 nm, still more preferably 30 to 1000 nm, particularly preferably 50 to 500 nm, and extremely preferably 50 to 300 nm. When the thickness is 10 nm or more, the uniform plating layer 6 tends to be easily formed by electrolytic plating. When the thickness is 5000 nm or less, it is possible to moderately shorten the removal time of the seed metal layer 5 by etching or polishing, which can suppress the removal cost of the seed metal layer 5.

The conductor layer 7 may be heated for the purpose of an improvement in adhesion and the like after the formation of the conductor layer 7. A heating temperature is usually 50 to 350° C., and preferably 80 to 250° C. Heating may be carried out under a pressurized condition. Examples of a pressurizing method include a method for using physical pressurizing means such as a heat pressing machine or a pressurizing-heating roll machine. A pressure to be applied is usually 0.1 to 20 MPa, and preferably 0.5 to 10 MPa. This range tends to provide excellent adhesion between the seed metal layer 5 and the resin pattern 4 or between the seed metal layer 5 and the baseplate 1.

In the step (d), as shown in FIG. 2(e), the conductor layer 7 is formed over the exposed part of the baseplate 1 and the exposed part of the resin pattern 4. That is, plating (metal film) is formed also in a region other than a region (circuit groove 3) on which a conductor pattern 8 is to be formed. Therefore, the step (d) can also be considered as a step of removing the metal film formed in a region other than the circuit groove 3 in the conductor layer 7.

The method for removing a part of the conductor layer 7 may be a known method for removing a metal. For example, the method may be a polishing (mechanical polishing and the like) method and/or an etching method.

In removing a part of the conductor layer 7 by mechanical polishing, the mechanical polishing method is preferably a chemical mechanical polishing (hereinafter, referred to as "CMP") method. For example, the method for removing a part of the conductor layer 7 by the CMP method may be a method for attaching a polishing cloth (polishing pad) onto a polishing surface plate (platen), wetting the polishing cloth surface with a polishing agent for metals, pressing the surface of the conductor layer 7 against the polishing cloth surface, rotating the polishing surface plate with a predetermined pressure (hereinafter, referred to as "polishing pressure") being applied to the surface of the conductor layer 7 from the back surface thereof, and removing a part of the conductor layer 7 by mechanical friction between the polishing agent and the surface of the conductor layer 7.

A polishing agent for metals used for CMP may contain, for example, an oxidizing agent and a solid abrasive grain (hereinafter, simply referred to as an "abrasive grain"), or may further contain a metal oxide solubilizer, a protective film-forming agent and the like if necessary. The basic mechanism of CMP employing a polishing agent containing an oxidizing agent and an abrasive grain is considered as follows. It is considered that the metal film is polished by, first, oxidizing the metal film surface to be polished with the oxidizing agent to form an oxidation layer, and shaving of the oxidation layer with the abrasive grain. Since the oxidation layer on the metal film surface formed in the circuit groove 3 is not significantly contacted by the polishing cloth when the metal film is polished by such a mechanism, the metal film formed in the circuit groove 3 is hardly reached by the shaving effect of the abrasive grain. Therefore, polishing proceeds by CMP and the metal film in the region other than the circuit groove 3 is removed, so that the polished surface tends to be smoothed.

The polishing agent is preferably a polishing agent which can be used at a polishing rate of 5000 to 3000 Å/min.

In removing a part of the conductor layer 7 by etching, examples of an etching method include a sandblast method and a wet etching process. For the sandblast method, for example, shaved particles of silica, alumina or the like are blown onto a portion to be removed in the conductor layer 7 for etching. For the wet etching process, an etching solution is used for etching. As the etching solution, for example, a cupric chloride solution, a ferric chloride solution, an alkali etching solution, an ammonium persulfate aqueous solution, and a hydrogen peroxide etching solution can be used.

In the conductor layer 7, the thickness of the metal film of a portion to be removed in the step (d) (that is, the region other than the circuit groove 3) may be about 0.1 to 35 μm.

The circuit board produced by the above-mentioned method allows the semiconductor elements mounted at corresponding positions to have ensured electrical connection. The above-mentioned method can obtain a circuit board having the fine conductor pattern 8.

<Cured Product and Semiconductor Device>

A cured product of the present embodiment is a cured product of the photosensitive resin composition of the present embodiment. A semiconductor device of the present embodiment comprises the cured product of the photosensitive resin composition of the present embodiment. The cured product of the photosensitive resin composition of the present embodiment can be suitably used as, for example, a surface protective film and/or an interlayer insulating film of semiconductor elements, or a solder resist and/or an interlayer insulating film in multilayered printed-wiring boards. The semiconductor device of the present embodiment comprises a circuit substrate (for example, circuit board) having the cured product of the photosensitive resin composition of the present embodiment.

Figure 3:
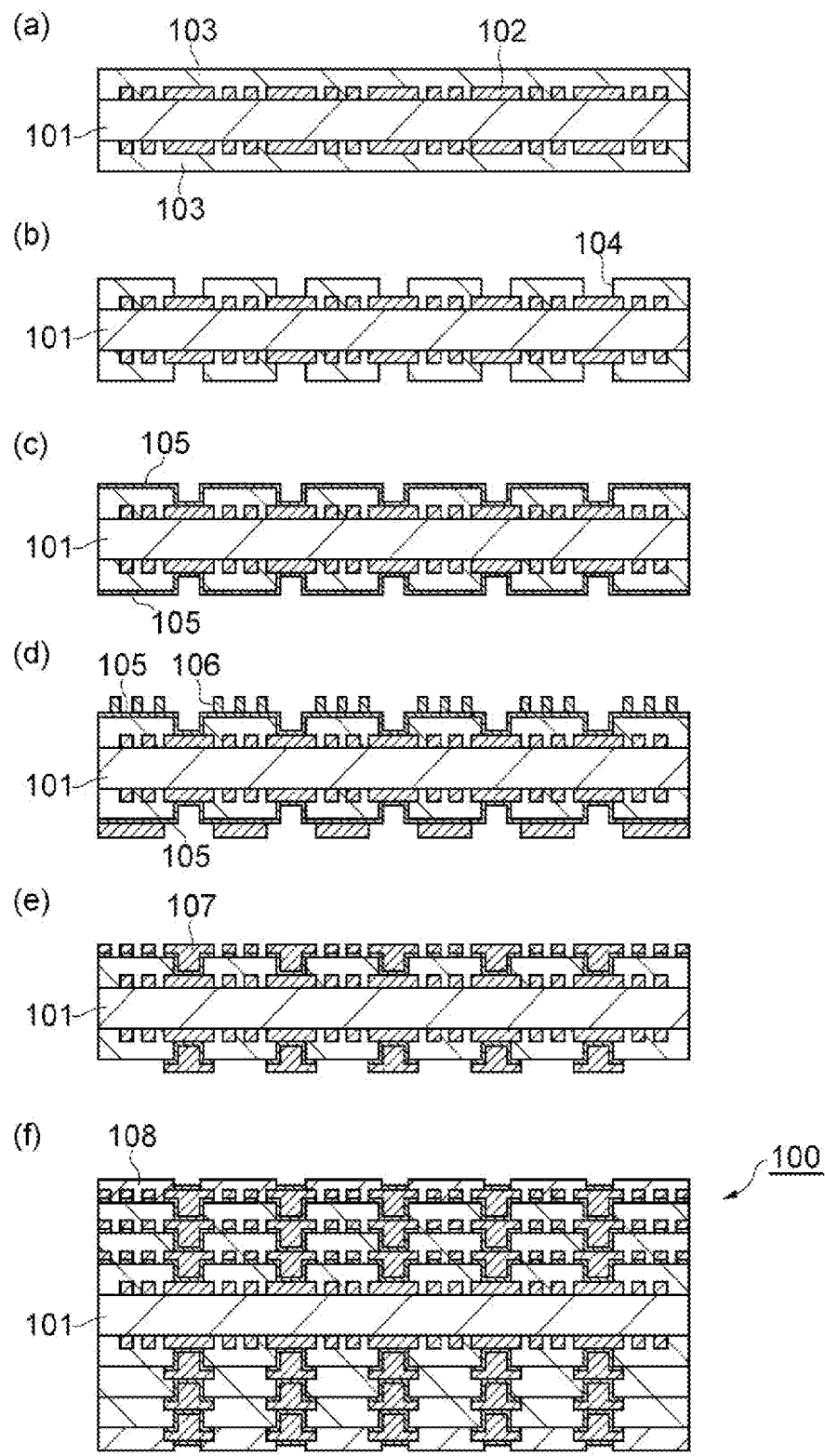
FIG. 3 is a schematic sectional view showing a method for producing a multilayered printed-wiring board of the present embodiment.

FIG. 3 shows a method for producing a multilayered printed-wiring board which comprises the cured product of the photosensitive resin composition of the present embodiment as a solder resist and/or an interlayer insulating film. A multilayered printed-wiring board 100 shown in FIG. 3(f) has wiring patterns on the surface and on the inside. The multilayered printed-wiring board 100 is obtained by stacking a copper-clad laminate, an interlayer insulating film, a metal foil and the like, and appropriately forming wiring patterns by etching or a semi-additive method. Hereinafter, the method for producing a multilayered printed-wiring board 100 of one embodiment of the present disclosure will be briefly described with reference to FIG. 3.

First, an interlayer insulating film 103 is formed on each surface of a substrate 101 having a wiring pattern 102 on the surface (refer to FIG. 3(a)). The interlayer insulating film 103 may be formed by printing the photosensitive resin composition using a screen printing machine or a roll coater, or by previously preparing the above-mentioned photosensitive element and attaching the photosensitive layer of the photosensitive element to the surface of a printed-wiring board using a laminater.

Subsequently, openings 104 are formed using YAG laser or carbon dioxide laser at portions required to be electrically connected to the outside (refer to FIG. 3(b)). Smears (residues) around the openings 104 are removed by a desmearing treatment.

Subsequently, a seed layer 105 is formed by electroless plating (refer to FIG. 3(c)). A photosensitive layer comprising the photosensitive resin composition (semi-additive photosensitive resin composition) is formed on the seed layer 105, and predetermined portions are subjected to exposure and a developing treatment to form a wiring pattern 106 (refer to FIG. 3(d)).

Subsequently, by electrolytic plating, a wiring pattern 107 is formed in a portion in which the resin pattern 106 is not formed in the seed layer 105, and the resin pattern 106 is removed with a stripping solution, followed by removing a portion in which the wiring pattern 107 is not formed in the seed layer 105 by etching (refer to FIG. 3(e)).

The multilayered printed-wiring board 100 can be produced by repeating the above-mentioned operations, and forming a solder resist 108 containing the cured product of the above-mentioned photosensitive resin composition on the outermost surface (refer to FIG. 3(f)). The thus obtained multilayered printed-wiring board 100 allows the semiconductor elements mounted at corresponding positions to have ensured electrical connection.

EXAMPLES

Hereinafter, the present disclosure will be described in detail with reference to Examples, but the present disclosure is not limited thereto.

Examples 1 to 4 and Comparative Examples 1 to 3

Triarylsulfonium salts (B-1 to B-5), an alkoxy alkyl compound (C-1), a compound having a glycidyloxy group (D-1), a compound having an acryloyloxy group (D-2), a sensitizer (E-1), a solvent (F-1), and a compound having a Si—O bond (G-1) in blended amounts (unit: parts by mass) shown in Tables 1 and 2 below were blended with 100 parts by mass of resin components (A-1 to A-3) to obtain a photosensitive resin composition. The resin components (A-1 to A-3) and the triarylsulfonium salts (B-1 to B-5) were blended so that solid contents had parts by mass shown in Tables 1 and 2.

The abbreviated names of Tables 1 and 2 are as follows.

A-1: cresol novolac resin (manufactured by Asahi Organic Chemicals Industry Co., Ltd., trade name: EP4020G, weight average molecular weight: 13000)

A-2: cresol novolac resin (manufactured by Asahi Organic Chemicals Industry Co., Ltd., trade name: TR4020G, weight average molecular weight: 13000)

A-3: cresol novolac resin (manufactured by Asahi Organic Chemicals Industry Co., Ltd., trade name: TR4080G, weight average molecular weight: 5000)

B-1: triarylsulfonium salt (manufactured by San-Apro Ltd., trade name: CPI-110B, anion: tetrakis(pentafluorophenyl)borate)

B-2: triarylsulfonium salt (manufactured by San-Apro Ltd., trade name: CPI-310B, anion: tetrakis(pentafluorophenyl)borate)

B-3: triarylsulfonium salt (manufactured by San-Apro Ltd., trade name: CPI-101A, anion: hexafluoroantimonate)

B-4: triarylsulfonium salt (manufactured by San-Apro Ltd., trade name: CPI-210S, anion: phosphorous anion)

B-5: triarylsulfonium salt (manufactured by San-Apro Ltd., trade name: CPI-300P(G anion: phosphorous anion)

C-1: 1,3,4,6-tetrakis(methoxymethyl)glycoluril (manufactured by Sanwa Chemical Co., Ltd., trade name: Nikalac MX-270)

D-1: trimethylolpropane triglycidyl ether (manufactured by Nippon Steel and Sumikin Chemical Co., Ltd., trade name: ZX-1542)

D-2: pentaerythritol triacrylate (manufactured by Nippon Kayaku Co., Ltd., trade name: PET-30)

E-1: 9,10-dibutoxyanthracene (manufactured by Kawasaki Kasei Chemicals Ltd., trade name: DBA)

F-1: methyl ethyl ketone (manufactured by Wako Pure Chemical Industries, Ltd., trade name: 2-BUTANONE)

G-1: 3-glycidoxypropyltrimethoxysilane (manufactured by Shin-Etsu Chemical Co., Ltd., trade name: KBM-403)

The photosensitive resin composition was applied on a polyethylene terephthalate film (manufactured by Teijin DuPont Films Ltd., trade name: PUREX A53, "PUREX" is registered trademark) (support) so that the photosensitive resin composition had a uniform thickness, and dried for 10 minutes with a hot air convection dryer at 90° C. After drying, covering was performed with a polyethylene film (manufactured by Tamapoly Co., Ltd., trade name: NF-15) (protective layer) to obtain a photosensitive element comprising a photosensitive layer having a thickness of 25 μm.

(Evaluation of Resolution and Sensitivity)

The protective layer of the photosensitive element was peeled off, and the photosensitive element was laminated on a silicon wafer having a diameter of 6-inch to obtain a laminated body comprising the support, the photosensitive layer and the silicon wafer in this order. The lamination was performed using a heat roll at 100° C. with a compressive pressure of 0.4 MPa at a roll speed of 1.0 m/min. Subsequently, the support of the laminated body was peeled off, and the photosensitive layer was subjected to reduced projection exposure with i-line (365 nm) through a mask by using an i-line stepper (manufactured by Canon Inc., trade name: FPA-3000iW). The mask for use had patterns with a width ratio between exposed parts and unexposed parts of 1:1 at 1 μm intervals from 2 μm:2 μm to 30 μm:30 μm. Reduced projection exposure was performed with the exposure amount changed in the range of 100 to 3000 mJ/cm$^2$ at an interval of 50 mJ/cm$^2$.

The exposed photosensitive layer was heated at 65° C. for 1 minute, and then at 95° C. for 4 minutes (post-exposure baking). Subsequently, a developer was sprayed (pump discharge pressure [developer]: 0.16 MPa) to the photosensitive layer by using a 2.38 mass % tetramethylammonium hydroxide aqueous solution (manufactured by Tama Chemicals Co., Ltd., trade name: TMAH2.38%) as the developer and by using a developing machine (manufactured by TAKIZAWA CO., LTD., trade name: AD-1200) for a time period which was four times as long as the shortest developing time period (the shortest time for removing the unexposed part) to remove the unexposed part. Subsequently, purified water (manufactured by Wako Pure Chemical Industries, Ltd.) as a rinse agent was sprayed (pump discharge pressure [rinse agent]: 0.12 to 0.14 MPa) for 30 seconds to flush the developer. Then, a resin pattern was formed by drying. The formed resin pattern was observed at a magnification ratio of 1000 times with a metallurgical microscope. The smallest space width of the patterns having clearly removed space portions (unexposed parts) and line portions (exposed parts) formed without occurrence of meandering or chipping was obtained as resolution, and the exposure amount on that occasion was evaluated as sensitivity. The evaluation results are shown in Table 1.

(Evaluation of HAST Resistance (HAST Condition A))

A copper surface of a baseplate for a printed-wiring board (manufactured by Hitachi Chemical Co., Ltd., trade name: MCL E-679) having a structure obtained by laminating a copper foil having a thickness of 12 μm on a glass epoxy substrate was etched, to form a comb-shaped electrode having a line/space of 20 μm/20 μm. This baseplate was used as a baseplate for evaluation, and a cured product of a resist (permanent resist film) was formed on the baseplate for evaluation in the same manner as in the above-mentioned <Evaluation of Resolution and Sensitivity>. Then, a test was performed under conditions of 130° C., 85% RH and 6.0 V for 500 hours. The case where resistance measured at each time was $1 \times 10^{-6}$ or less was determined to be short failures, and HAST resistance was evaluated according to the following criteria. The evaluation results are shown in Tables 1 and 2.

"A": No short circuit occurred for 500 hours or more.

"B": A short circuit occurred during 300 hours or more and less than 500 hours.

"C": A short circuit occurred during 200 hours or more and less than 300 hours.

"D": A short circuit occurred during 100 hours or more and less than 200 hours.

"E": A short circuit occurred during less than 100 hours.

(Evaluation of HAST Resistance (HAST Condition B))

A copper surface of a baseplate for a printed-wiring board (manufactured by Hitachi Chemical Co., Ltd., trade name: MCL E-679) having a structure obtained by laminating a copper foil having a thickness of 12 μm on a glass epoxy substrate was etched, to form a comb-shaped electrode having a line/space of 5 μm/5 μm. This baseplate was used as a baseplate for evaluation, and a cured product of a resist (permanent resist film) was formed on the baseplate for evaluation in the same manner as in the above-mentioned <Evaluation of Resolution and Sensitivity>. Then, a test was performed under conditions of 130° C., 85% RH and 6.0 V for 500 hours. The case where resistance measured at each time was $1 \times 10^{-6}$ or less was determined to be short failures, and HAST resistance was evaluated according to the following criteria. The evaluation results are shown in Table 2.

"A": No short circuit occurred for 100 hours or more.

"B": A short circuit occurred during 50 hours or more and less than 100 hours.

"C": A short circuit occurred during 25 hours or more and less than 50 hours.

"D": A short circuit occurred during 10 hours or more and less than 25 hours.

"E": A short circuit occurred during less than 10 hours.

TABLE 1

| | Examples | | Comparative Examples | | |
|---|---|---|---|---|---|
| Item | 1 | 2 | 1 | 2 | 3 |
| A-1 | 100 | 100 | 100 | 100 | 100 |
| B-1 | 6.4 | — | — | — | — |
| B-2 | — | 6.4 | — | — | — |
| B-3 | — | — | 6.4 | — | — |
| B-4 | — | — | — | 6.4 | — |
| B-5 | — | — | — | — | 6.4 |
| C-1 | 29 | 29 | 29 | 29 | 29 |
| D-1 | 43 | 43 | 43 | 43 | 43 |
| E-1 | 0.07 | 0.07 | 0.07 | 0.07 | 0.07 |
| F-1 | 115 | 115 | 115 | 115 | 115 |
| Anion of component (B) | $B(C_6F_5)_4^-$ | $B(C_6F_5)_4^-$ | $SbF_6^-$ | Phosphorous anion | Phosphorous anion |
| Resolution [μm] | 6 | 5 | 6 | 6 | 5 |
| Sensitivity [mJ/cm$^2$] | 1350 | 2200 | 1800 | 2200 | 1050 |
| HAST resistance (condition A) | A | A | E | E | E |

TABLE 2

| | Examples | |
|---|---|---|
| Item | 3 | 4 |
| A-2 | 50 | 100 |
| A-3 | 50 | — |
| B-2 | 8.0 | 8.0 |
| C-1 | 29 | 29 |
| D-1 | — | 43 |
| D-2 | 50 | — |
| F-1 | 110 | 100 |
| G-1 | 5.4 | 5.4 |
| Anion of component (B) | $B(C_6F_5)_4^-$ | $B(C_6F_5)_4^-$ |
| HAST resistance (condition A) | A | A |
| HAST resistance (condition B) | A | D |

As clearly shown in Table 1, it was found that Examples 1 and 2 have much more excellent HAST resistance, and therefore, they have excellent insulation reliability between fine wirings, as compared to Comparative Examples 1 to 3. Further, as clearly shown in Table 2, it was found that Example 3 using the compound having an acryloyloxy group as the component (D) has much more excellent HAST resistance on the condition B severer than the condition A, and therefore, it has excellent insulation reliability between narrower fine wirings, as compared to Example 4 using the compound having a glycidyloxy group.

Reference Example 1

[Preparation of Photosensitive Resin Composition]

8 parts by mass of (B-2) a triarylsulfonium salt (manufactured by San-Apro Ltd., trade name: CPI-310B), 28 parts by mass of (C-1) 1,3,4,6-tetrakis(methoxymethyl)glycoluril (manufactured by Sanwa Chemical Co., Ltd., trade name: MX-270), 43 parts by mass of (D-1) trimethylolpropane triglycidyl ether (manufactured by Nippon Steel and Sumikin Chemical Co., Ltd., trade name: ZX-1542), 100 parts by mass of (F-1) methyl ethyl ketone (manufactured by Wako Pure Chemical Industries, Ltd., trade name: 2-BUTANONE), and 3 parts by mass of (G-1) 3-glycidoxypropyltrimethoxysilane (manufactured by Shin-Etsu Chemical Co., Ltd., trade name: KBM-403) were blended with 100 parts by mass of (A-2) a cresol novolac resin (manufactured by Asahi Organic Chemicals Industry Co., Ltd., trade name: TR4020G), to obtain a photosensitive resin composition.

[Production of Photosensitive Element]

The photosensitive resin composition was applied on a polyethylene terephthalate film (manufactured by Teijin DuPont Films Ltd., trade name: PUREX A53) (support) so that the photosensitive resin composition had a uniform thickness. Subsequently, drying was performed for 10 minutes with a hot air convection dryer at 90° C. to form a photosensitive layer having a dried thickness of 10 μm. A polyethylene film (manufactured by Tamapoly Co., Ltd., trade name: NF-15) (protective layer) was attached on this photosensitive layer to obtain a photosensitive element in which the support, the photosensitive layer and the protective layer were laminated in order.

[Production of Circuit Board: Formation of Resin Pattern]

While peeling the protective layer of the photosensitive element comprising the photosensitive layer having a thickness of 10 μm, the photosensitive element was laminated on a 6-inch silicon wafer so that the photosensitive layer came in contact with the silicon surface. Subsequently, the support of the photosensitive element was peeled off, so that a silicon baseplate comprising a photosensitive layer having a thickness of 10 μm was obtained. The lamination was performed using a heat roll at 120° C. with a compressive pressure of 0.4 MPa at a roll speed of 1.0 m/min.

The obtained photosensitive layer was subjected to exposure with i-line (365 nm) in an exposure amount of 2000 mJ/cm$^2$ by using an i-line stepper (manufactured by Canon Inc., trade name: FPA-3000iW). The exposed photosensitive layer (coating film) was heated at 65° C. for 1 minute, and then heated at 95° C. for 4 minutes. Further, heat-treatment was performed with a hot air convection dryer at 180° C. for 60 minutes to obtain a cured resin layer (cured film) on a silicon wafer.

While peeling the protective layer of the photosensitive element comprising the photosensitive layer having a thickness of 10 μm, the photosensitive element was laminated on the obtained 6-inch silicon wafer having the cured film so that the photosensitive layer came in contact with the cured film. Subsequently, the support was peeled off to obtain a photosensitive layer having a thickness of 10 μm on the cured film. The lamination was performed using a heat roll at 120° C. with a compressive pressure of 0.4 MPa at a roll speed of 1.0 m/min.

The obtained photosensitive layer (coating film) was subjected to reduced projection exposure with i-line (365 nm) through a mask by using an i-line stepper (manufactured by Canon Inc., trade name: FPA-3000iW). The mask for use had patterns with a width ratio between exposed parts and unexposed parts of 1:1 at 1 μm intervals in the range from 2 μm:2 μm to 30 μm:30 μm of line width:space width. Reduced projection exposure was performed with the exposure amount changed in the range of 100 to 3000 mJ/cm$^2$ at an interval of 100 mJ/cm$^2$.

The exposed photosensitive layer (coating film) was heated at 65° C. for 1 minute, and then at 95° C. for 4 minutes (post-exposure baking). Subsequently, developing treatment was performed by immersing in a 2.38 mass % tetramethylammonium hydroxide aqueous solution for a time period which was two times as long as the shortest developing time period (the shortest time for removing the unexposed part) to remove the unexposed part. Further, heat-treatment was performed at 180° C. for 60 minutes with a hot air convection dryer to obtain a resin pattern on a silicon wafer.

[Formation of Conductor Pattern]

A sputtered metal film (seed metal layer) made of titanium was formed to have a thickness of 0.1 μm on the exposed part of the silicon baseplate and the exposed part of the resin pattern which were obtained above, by using a sputtering device. Subsequently, a sputtered metal film made of copper was formed to have a thickness of 0.1 μm. Further, copper sulfate electrolytic plating was performed on the sputtered film. Then, an annealing treatment was performed at 180° C. for 60 minutes to form a conductor layer (titanium layer and copper layer) having a thickness of 10 μm on the exposed part of the silicon baseplate and the exposed part of the resin pattern.

The conductor layer obtained above was polished by CMP at a polishing pressure of 13 kPa using a polishing device and a polishing agent to form a conductor pattern. As a result of observing the formed conductor pattern with a metallurgical microscope, the smallest line width of the patterns having line portions (conductor portions) formed without occurrence of meandering or chipping was 3 μm.

Reference Example 2

A conductor pattern was formed in the same manner as in Reference Example 1 except that (A-2) was replaced by (A-3) a cresol novolac resin (manufactured by Asahi Organic Chemicals Industry Co., Ltd., trade name: TR4080G) in the preparation of the photosensitive resin composition of Reference Example 1. As a result of observing the formed conductor pattern with a metallurgical microscope, the smallest line width of the patterns having line portions (conductor portions) formed without occurrence of meandering or chipping was 3 μm.

Reference Example 3

A conductor pattern was formed in the same manner as in Reference Example 1 except that (D-1) was replaced by (D-2) pentaerythritol triacrylate (manufactured by Nippon Kayaku Co., Ltd., trade name: PET-30) in the preparation of the photosensitive resin composition of Reference Example 1. As a result of observing the formed conductor pattern with a metallurgical microscope, the smallest line width of the patterns having line portions (conductor portions) formed without occurrence of meandering or chipping was 5 μm.

Reference Example 4

A conductor pattern was formed in the same manner as in Reference Example 3 except that (A-2) was replaced by (A-3) a cresol novolac resin (manufactured by Asahi Organic Chemicals Industry Co., Ltd., trade name: TR4080G) in the preparation of the photosensitive resin composition of Reference Example 3. As a result of observing the formed conductor pattern with a metallurgical microscope, the smallest line width of the patterns having line portions (conductor portions) formed without occurrence of meandering or chipping was 5 μm.

Reference Example 5

A conductor pattern was formed in the same manner as in Reference Example 3 except that 50 parts by mass of 100 parts by mass of the novolac resin (A-2) was replaced by 50 parts by mass of (A-3) a cresol novolac resin (manufactured by Asahi Organic Chemicals Industry Co., Ltd., trade name: TR4080G) in the preparation of the photosensitive resin composition of Reference Example 3. As a result of observing the formed conductor pattern with a metallurgical microscope, the smallest line width of the patterns having line portions (conductor portions) formed without occurrence of meandering or chipping was 5 μm.

Reference Example 6

A conductor pattern was formed in the same manner as in Reference Example 1 except that 10 parts by mass of silica particles subjected to a coupling treatment with 3-methacryloyloxypropyltrimethoxysilane and having an average primary particle diameter of 15 nm were further added in the preparation of the photosensitive resin composition of Reference Example 1. As a result of observing the formed conductor pattern with a metallurgical microscope, the smallest line width of the patterns having line portions (conductor portions) formed without occurrence of meandering or chipping was 7 μm.

Reference Example 7

A conductor pattern was formed in the same manner as in Reference Example 1 except that a metal layer (seed metal layer) made of copper and having a thickness of 0.5 μm was formed by electroless plating in place of the formation of the seed metal layer by the sputtering device in the formation of the conductor pattern of Reference Example 1. As a result of observing the formed conductor pattern with a metallurgical microscope, the smallest line width of the patterns having line portions (conductor portions) formed without occurrence of meandering or chipping was 5 μm.

Reference Example 8

A conductor pattern was formed in the same manner as in Reference Example 1 except that, in the formation of the conductor pattern of Reference Example 1, a conductor layer (titanium layer and copper layer) having a thickness of 10 μm was formed on the exposed part of the silicon baseplate and the exposed part of the resin pattern, and then the polishing by CMP was replaced by an etching treatment. As a result of observing the formed conductor pattern with a metallurgical microscope, the smallest line width of the patterns having line portions (conductor portions) formed without occurrence of meandering or chipping was 3 μm.

INDUSTRIAL APPLICABILITY

The embodiment of the present disclosure provides a photosensitive resin composition having excellent resin pattern resolution. The embodiment of the present disclosure provides a photosensitive resin composition which can obtain a cured product having excellent HAST resistance and has excellent resin pattern resolution. The photosensitive resin composition of the present disclosure can be applied as a material for use in the surface protective film or the interlayer insulating film of semiconductor elements. Also, it can be applied as a material for use in the solder resist or the interlayer insulating film of wiring board materials. In particular, the photosensitive resin composition of the present disclosure has both excellent resolution and excellent insulation reliability between fine wirings after curing, which is suitably used in thinned and densified highly integrated package baseplates and the like.

REFERENCE SIGNS LIST

1: baseplate, 2: photosensitive layer, 2a, 4, 106: resin pattern, 3: circuit groove, 5: seed metal layer, 6: plating layer, 7: conductor layer, 8: conductor pattern, 9: support, 10: protective layer, 11: photosensitive element, 100: multilayered printed-wiring board, 101: substrate, 102, 107: wiring pattern, 103: interlayer insulating film, 104: opening, 105: seed layer, 108: solder resist.

The invention claimed is:

1. A photosensitive resin composition comprising:
a component (A): a resin having a phenolic hydroxyl group;
a component (B): a photosensitive acid generator;
a component (C): a compound having at least one selected from the group consisting of an aromatic ring, a heterocycle and an alicycle, and at least one selected from the group consisting of a methylol group and an alkoxyalkyl group; and
a component (D): an aliphatic compound having two or more functional groups, each of the two or more functional groups being the same or different and being selected from the group consisting of an acryloyloxy group, a methacryloyloxy group, a glycidyloxy group, an oxetanyl alkyl ether group, a vinyl ether group and a hydroxyl group,
wherein the component (B) is a sulfonium salt containing an anion having a substituted or unsubstituted tetraphenylborate skeleton.

2. The photosensitive resin composition according to claim 1, wherein the anion of the component (B) is tetrakis(pentafluorophenyl)borate.

3. The photosensitive resin composition according to claim 1, wherein a content of the component (D) is 1 to 70 parts by mass with respect to 100 parts by mass of the component (A).

4. The photosensitive resin composition according to claim 1, further comprising a compound having a Si—O bond.

5. A photosensitive element comprising:
a support; and
a photosensitive layer provided on the support,
wherein the photosensitive layer comprises the photosensitive resin composition according to claim 1.

6. A method for forming a resist pattern, comprising:
a step of disposing the photosensitive layer of the photosensitive element according to claim 5 on a substrate;
an exposing step of exposing the photosensitive layer in order to form a predetermined pattern;
a developing step of developing the photosensitive layer after the exposing step to obtain a resin pattern; and
a heat-treating step of heat-treating the resin pattern.

7. A cured product of the photosensitive resin composition according to claim 1.

8. A semiconductor device comprising the cured product of the photosensitive resin composition according to claim 7.

9. A method for forming a resist pattern, comprising:
a step of forming a photosensitive layer comprising the photosensitive resin composition according to claim 1 on a substrate;
an exposing step of exposing the photosensitive layer in order to form a predetermined pattern;
a developing step of developing the photosensitive layer after the exposing step to obtain a resin pattern; and
a heat-treating step of heat-treating the resin pattern.

10. The method for forming a resist pattern according to claim 9, further comprising a step of heat-treating the photosensitive layer between the exposing step and the developing step.

11. A method for producing a circuit substrate, comprising:
a conductor layer forming step of subjecting at least a part of an exposed part of the resin pattern after the heat-treating step in the method for forming a resist pattern according to claim 9, and at least a part of an exposed part of the substrate to a plating treatment, to form a conductor layer; and
a conductor pattern forming step of removing a part of the conductor layer to form a conductor pattern,
wherein the circuit substrate includes a resin pattern and a conductor pattern.

12. The method for producing a circuit substrate according to claim 11, wherein the conductor layer forming step includes a step of performing electrolytic plating after performing electroless plating, to form the conductor layer.

13. The method for producing a circuit substrate according to claim 11, wherein the conductor layer forming step includes a step of performing electrolytic plating after performing sputtering, to form the conductor layer.

14. The method for producing a circuit substrate according to claim 11, wherein the conductor pattern forming step includes a step of removing a part of the conductor layer by etching, to form the conductor pattern.

15. The method for producing a circuit substrate according to claim 11, wherein the conductor pattern forming step includes a step of removing a part of the conductor layer by polishing, to form the conductor pattern.

16. The photosensitive resin composition according to claim 1, wherein the component (C) is 1,3,4,6-tetrakis (methoxymethyl)glycoluril.

17. The photosensitive resin composition according to claim 1, wherein the component (D) is trimethylolpropane triglycidyl ether.

18. The photosensitive resin composition according to claim 1, wherein the component (D) is pentaerythritol triacrylate.

19. The photosensitive resin composition according to claim 1, wherein, the component (D) has at least one each of two or more categories of different functional groups, the categories of different functional groups being selected from the group consisting of an acryloyloxy group, a methacryloyloxy group, a glycidyloxy group, an oxetanyl alkyl ether group, a vinyl ether group and a hydroxyl group.

20. The photosensitive resin composition according to claim 1, wherein, the component (D) has two or more of one functional group category selected from the group consisting of an acryloyloxy group, a methacryloyloxy group, a glycidyloxy group, an oxetanyl alkyl ether group, a vinyl ether group and a hydroxyl group.

\* \* \* \* \*